(12) United States Patent
Nakagawa et al.

(10) Patent No.: US 12,382,576 B2
(45) Date of Patent: Aug. 5, 2025

(54) RADIO-FREQUENCY MODULE AND COMMUNICATION DEVICE

(71) Applicant: Murata Manufacturing Co., Ltd., Kyoto (JP)

(72) Inventors: Dai Nakagawa, Kyoto (JP); Takanori Uejima, Kyoto (JP); Yuji Takematsu, Kyoto (JP); Yukiya Yamaguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 420 days.

(21) Appl. No.: 18/157,157

(22) Filed: Jan. 20, 2023

(65) Prior Publication Data

US 2023/0164906 A1 May 25, 2023

Related U.S. Application Data

(63) Continuation of application No. PCT/JP2021/028578, filed on Aug. 2, 2021.

(30) Foreign Application Priority Data

Aug. 12, 2020 (JP) ................. 2020-136490

(51) Int. Cl.
*H04B 1/00* (2006.01)
*H03F 3/24* (2006.01)
(Continued)

(52) U.S. Cl.
CPC .......... *H05K 1/0216* (2013.01); *H03F 3/245* (2013.01); *H04B 1/40* (2013.01); *H05K 1/0203* (2013.01);
(Continued)

(58) Field of Classification Search
CPC .. H05K 1/0216; H05K 1/0203; H05K 1/0243; H05K 2201/1006;
(Continued)

(56) References Cited

U.S. PATENT DOCUMENTS

2008/0227479 A1 9/2008 Iwata
2017/0273183 A1* 9/2017 Kawasaki ................ H03H 3/08
(Continued)

FOREIGN PATENT DOCUMENTS

JP 2006-120981 A 5/2006
JP 2015-015546 A 1/2015
(Continued)

OTHER PUBLICATIONS

International Search Report for PCT/JP2021/028578 dated Oct. 12, 2021.

*Primary Examiner* — Ping Y Hsieh
(74) *Attorney, Agent, or Firm* — McDonald Hopkins LLC

(57) ABSTRACT

Improvement in heat dissipation capability is intended. A radio-frequency module includes a mounting substrate, a first transmission filter, a second transmission filter, a resin layer, and a shield layer. The second transmission filter is higher in power class than the first transmission filter. The resin layer covers at least part of an outer peripheral surface of the first transmission filter and covers at least part of an outer peripheral surface of the second transmission filter. The shield layer overlaps at least part of the second transmission filter in plan view in a thickness direction of the mounting substrate. At least part of a major surface of the second transmission filter on an opposite side to the mounting substrate side is in contact with the shield layer.

17 Claims, 12 Drawing Sheets

(51) Int. Cl.
*H04B 1/40* (2015.01)
*H05K 1/02* (2006.01)

(52) U.S. Cl.
CPC ..... *H05K 1/0243* (2013.01); *H03F 2200/165* (2013.01); *H03F 2200/451* (2013.01); *H05K 2201/1006* (2013.01)

(58) Field of Classification Search
CPC ......... H05K 2201/0715; H05K 1/0218; H05K 3/284; H03F 3/245; H03F 2200/165; H03F 2200/451; H03F 2200/111; H03F 2203/7209; H03F 3/195; H03F 3/211; H03F 3/72; H04B 1/40; H04B 1/00; H04B 1/38; H01L 23/00; H01L 23/28; H01L 25/04; H01L 25/10; H01L 25/18; H03H 7/46; H03H 9/25; H03H 9/70; H03H 9/72
See application file for complete search history.

(56) References Cited

U.S. PATENT DOCUMENTS

| | | | |
|---|---|---|---|
| 2019/0230781 A1* | 7/2019 | Onodera | H05K 1/165 |
| 2021/0005579 A1* | 1/2021 | Matsumoto | H04B 1/40 |
| 2021/0099191 A1* | 4/2021 | Uejima | H03F 3/245 |
| 2021/0392536 A1 | 12/2021 | Fujimura et al. | |

FOREIGN PATENT DOCUMENTS

| | | |
|---|---|---|
| WO | 2008/053845 A1 | 5/2008 |
| WO | 2014/013831 A1 | 1/2014 |
| WO | 2016/088681 A1 | 6/2016 |
| WO | 2018/092529 A1 | 5/2018 |
| WO | 2019/181590 A1 | 9/2019 |
| WO | 2019/244816 A1 | 12/2019 |
| WO | 2020/095455 A1 | 5/2020 |

* cited by examiner

RADIO-FREQUENCY MODULE AND COMMUNICATION DEVICE

CROSS REFERENCE TO RELATED APPLICATION

This is a continuation of International Application No. PCT/JP2021/028578 filed on Aug. 2, 2021 which claims priority from Japanese Patent Application No. 2020-136490 filed on Aug. 12, 2020. The contents of these applications are incorporated herein by reference in their entireties.

BACKGROUND OF THE DISCLOSURE

Field of the Disclosure

The present disclosure generally relates to a radio-frequency module and a communication device and, more specifically, to a radio-frequency module that includes a transmission filter, and a communication device that includes the radio-frequency module.

Description of the Related Art

Patent Document 1 describes a radio-frequency module. The radio-frequency module includes a mounting substrate having a first major surface and a second major surface opposite to each other, a transmission filter mounted on the first major surface of the mounting substrate, a resin member (resin layer) covering the transmission filter, and a shield electrode layer (shield layer).

In the radio-frequency module described in Patent Document 1, the shield electrode layer is formed so as to cover the top surface and side surfaces of the resin member.

Patent Document 1 also describes a communication device including a radio-frequency module.

Patent Document 1: International Publication No. 2019/181590

BRIEF SUMMARY OF THE DISCLOSURE

In a radio-frequency module, improvement in heat dissipation capability is desired to suppress an increase in the temperature of the transmission filter.

It is a possible benefit of the present disclosure to provide a radio-frequency module and a communication device capable of improving the heat dissipation capability.

A radio-frequency module according to an aspect of the present disclosure includes a mounting substrate, a first transmission filter, a second transmission filter, a resin layer, and a shield layer. The mounting substrate has a first major surface and a second major surface opposite to each other. The first transmission filter is mounted on the first major surface of the mounting substrate. The second transmission filter is mounted on the first major surface of the mounting substrate and higher in power class than the first transmission filter. The resin layer is disposed on the first major surface of the mounting substrate. The shield layer covers at least part of the resin layer. The resin layer covers at least part of an outer peripheral surface of the first transmission filter and covers at least part of an outer peripheral surface of the second transmission filter. The shield layer overlaps at least part of the second transmission filter in plan view in a thickness direction of the mounting substrate. At least part of a major surface of the second transmission filter on an opposite side to the mounting substrate side is in contact with the shield layer.

A radio-frequency module according to an aspect of the present disclosure includes a mounting substrate, a first transmission filter, a second transmission filter, a metal member, a resin layer, and a shield layer. The mounting substrate has a first major surface and a second major surface opposite to each other. The first transmission filter is mounted on the first major surface of the mounting substrate. The second transmission filter is mounted on the first major surface of the mounting substrate and higher in power class than the first transmission filter. The metal member is disposed on a major surface of the second transmission filter on an opposite side to the mounting substrate side. The resin layer is disposed on the first major surface of the mounting substrate. The shield layer covers at least part of the resin layer. The resin layer covers at least part of an outer peripheral surface of the first transmission filter, covers at least part of an outer peripheral surface of the second transmission filter, and covers at least part of an outer peripheral surface of the metal member. The shield layer overlaps at least part of the metal member in plan view in a thickness direction of the mounting substrate. At least part of a major surface of the metal member on an opposite side to the mounting substrate side is in contact with the shield layer.

A radio-frequency module according to an aspect of the present disclosure includes a mounting substrate, a transmission filter, a resin layer, and a shield layer. The mounting substrate has a first major surface and a second major surface opposite to each other. The transmission filter is at least one transmission filter of a power class 1 transmission filter and a power class 2 transmission filter, mounted on the first major surface of the mounting substrate. The resin layer is disposed on the first major surface of the mounting substrate. The shield layer covers at least part of the resin layer. The resin layer covers at least part of an outer peripheral surface of the at least one transmission filter. The shield layer overlaps at least part of the at least one transmission filter in plan view in a thickness direction of the mounting substrate. At least part of a major surface of the at least one transmission filter on an opposite side to the mounting substrate side is in contact with the shield layer.

A radio-frequency module according to an aspect of the present disclosure includes a mounting substrate, a transmission filter, a metal member, a resin layer, and a shield layer. The mounting substrate has a first major surface and a second major surface opposite to each other. The transmission filter is at least one transmission filter of a power class 1 transmission filter and a power class 2 transmission filter, mounted on the first major surface of the mounting substrate. The metal member is disposed on a major surface of the at least one transmission filter on an opposite side to the mounting substrate side. The resin layer is disposed on the first major surface of the mounting substrate. The shield layer covers at least part of the resin layer. The resin layer covers at least part of an outer peripheral surface of the at least one transmission filter and covers at least part of an outer peripheral surface of the metal member. The shield layer overlaps at least part of the metal member in plan view in a thickness direction of the mounting substrate. At least part of a major surface of the metal member on an opposite side to the mounting substrate side is in contact with the shield layer.

A communication device according to an aspect of the present disclosure includes the radio-frequency module and a signal processing circuit. The signal processing circuit is connected to the radio-frequency module.

The radio-frequency module and the communication device according to the aspects of the present disclosure are capable of improving the heat dissipation capability.

DETAILED DESCRIPTION OF THE DISCLOSURE

Figure 1:
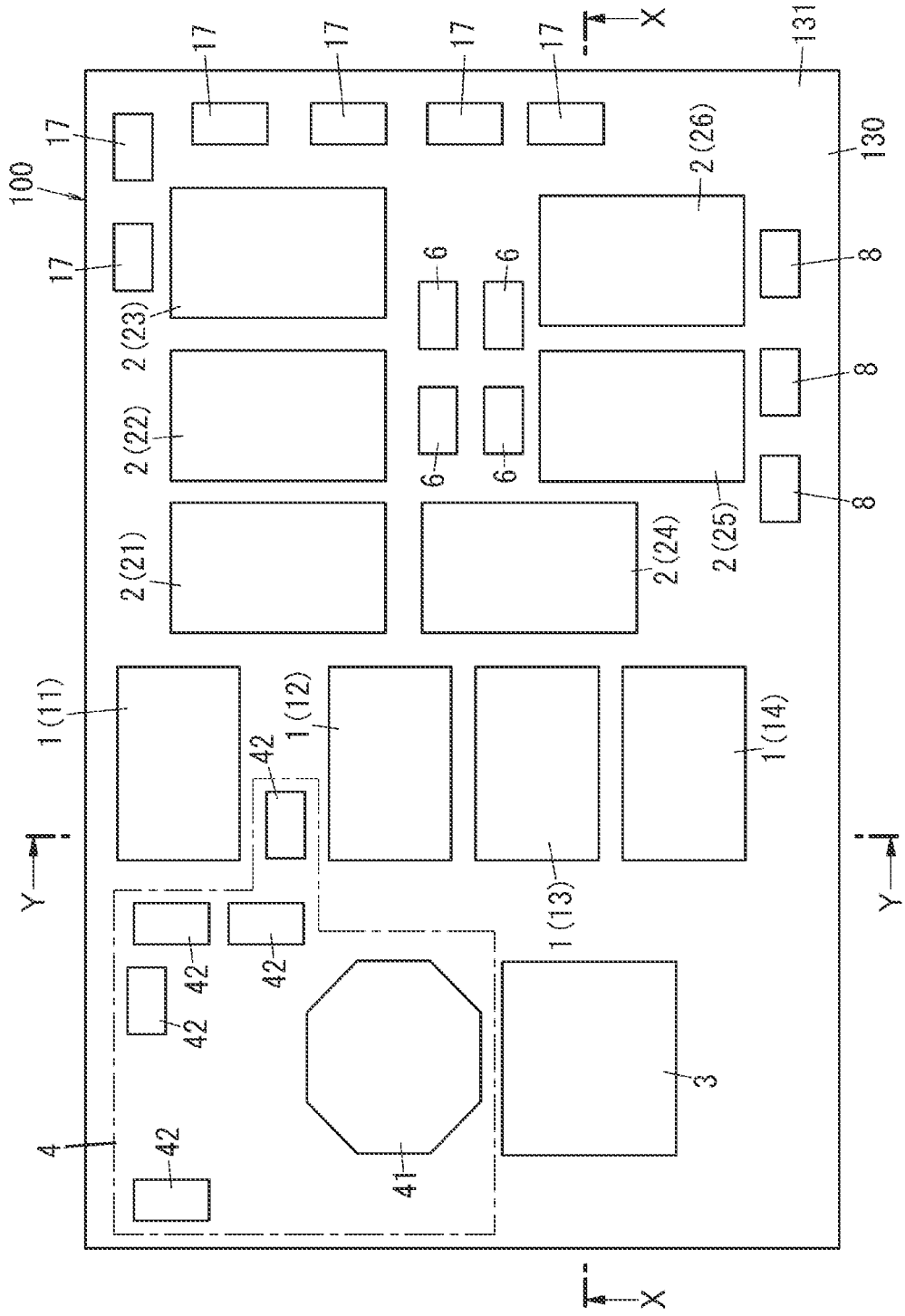
FIG. 1 is a plan view that relates to a radio-frequency module according to a first embodiment and from which a shield layer and a resin layer are omitted.

FIGS. 1 to 4, and 7 to 12 that will be referenced in the following embodiments and the like all are schematic diagrams, and the ratios of the sizes and thicknesses of component elements in the drawings do not always reflect actual scale ratios.

First Embodiment

As shown in FIGS. 1 to 4, a radio-frequency module 100 according to the first embodiment includes a mounting substrate 130, first transmission filters 11, 12, second transmission filters 13, 14, a resin layer 15, and a shield layer 16. The mounting substrate 130 has a first major surface 131 and a second major surface 132 opposite to each other. The first transmission filters 11, 12 are mounted on the first major surface 131 of the mounting substrate 130. The second transmission filters 13, 14 are mounted on the first major surface 131 of the mounting substrate 130 and are higher in power class than the first transmission filters 11, 12. The first transmission filters 11, 12 are, for example, power class 3 transmission filters. The second transmission filters 13, 14 are, for example, power class 2 transmission filters. The resin layer 15 is disposed on the first major surface 131 of the mounting substrate 130. The resin layer 15 covers at least part of an outer peripheral surface 103 of each of the first transmission filters 11, 12 and covers at least part of an outer peripheral surface 103 of each of the second transmission filters 13, 14. In the first embodiment, the resin layer 15 covers the entire outer peripheral surface 103 of each of the first transmission filters 11, 12 and covers the entire outer peripheral surface 103 of each of the second transmission filters 13, 14. The shield layer 16 covers at least part of the resin layer 15. The shield layer 16 overlaps at least part of each of the second transmission filters 13, 14 in plan view in a thickness direction D1 of the mounting substrate 130. In the first embodiment, the shield layer 16 overlaps the entire part of each of the second transmission filters 13, 14 in plan view in the thickness direction D1 of the mounting substrate 130. At least part of a major surface 102 of each of the second transmission filters 13, 14 on an opposite side to the mounting substrate 130 side is in contact with the shield layer 16. In other words, at least part of an area covered with the shield layer 16 on the major surface 102 of each of the second transmission filters 13, 14 on an opposite side to the mounting substrate 130 side is in contact with the shield layer 16. In the first embodiment, the entire part of the major surface 102 of each of the second transmission filters 13, 14 on an opposite side to the mounting substrate 130 side is in contact with the shield layer 16. Thus, the radio-frequency module 100 according to the first embodiment is capable of improving the heat dissipation capability.

Here, the term "power class" means a power class defined in 3GPP. A transmission filter has a higher power class as the transmission filter has a greater maximum transmission power. Specifically, power class decreases in order of power class 1 transmission filter, power class 2 transmission filter, and power class 3 transmission filter. The maximum transmission power of the power class 1 transmission filter is 29 dBm. The maximum transmission power of the power class 2 transmission filter is 26 dBm. The maximum transmission power of the power class 3 transmission filter is 23 dBm. In 5G NR as well, as in the case of 3GPP, power classes are defined.

Hereinafter, the radio-frequency module 100 and a communication device 300 according to the first embodiment will be described with reference to FIGS. 1 to 9.

Figure 5:
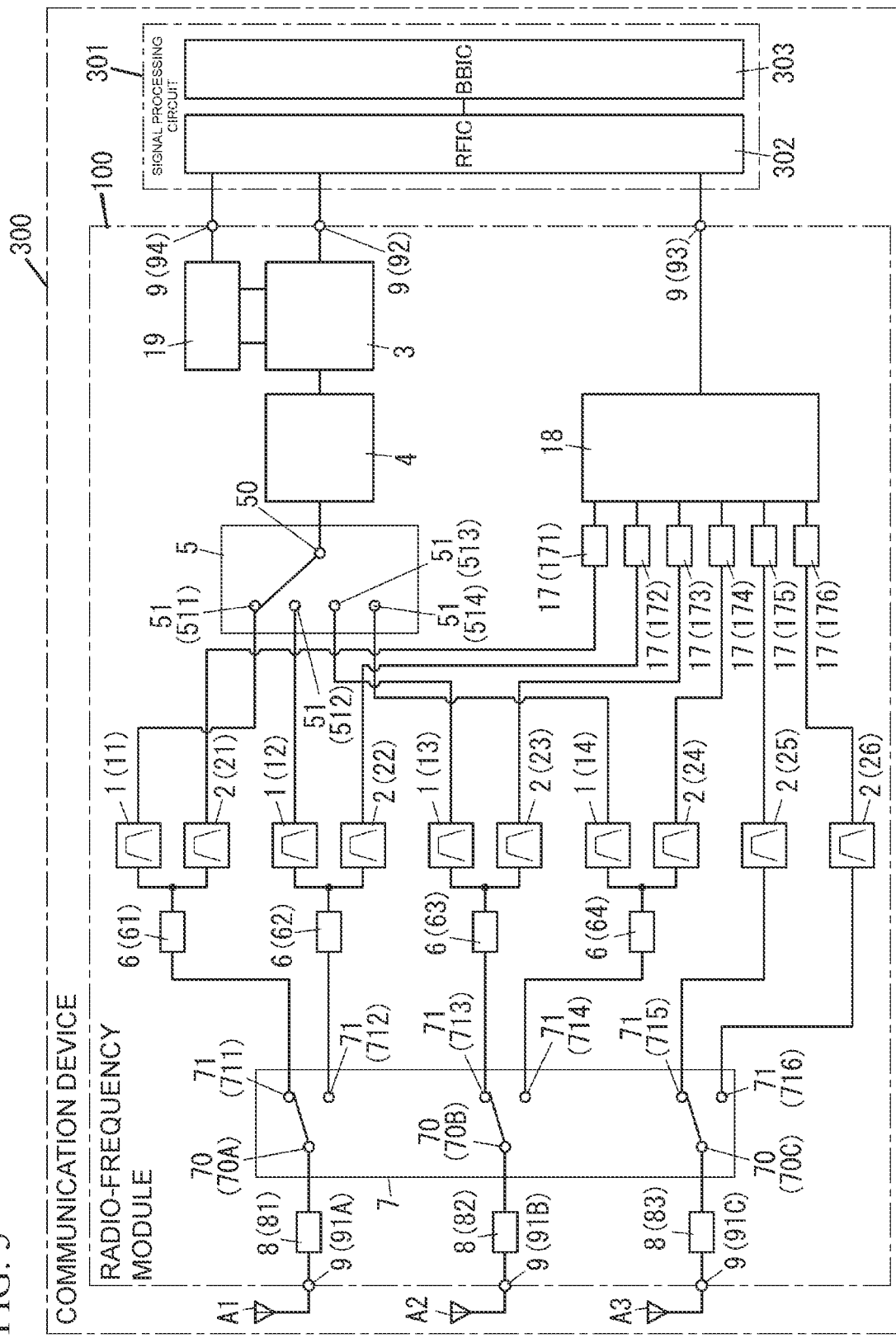
FIG. 5 is a circuit configuration diagram of a communication device that includes the radio-frequency module.

(1) Radio-Frequency Module and Communication Device
(1.1) Circuit Configuration of Radio-Frequency Module and Communication Device Initially, the circuit configuration of the radio-frequency module 100 and the communication device 300 according to the first embodiment will be described with reference to FIGS. 5 and 6.

The radio-frequency module 100 according to the first embodiment is used in, for example, the communication device 300 that supports multiband/multimode functionality. The communication device 300 is, for example, a mobile phone (for example, a smartphone); however, the configuration is not limited thereto. The communication device 300 may be, for example, a wearable terminal (for example, a smart watch). The radio-frequency module 100 is, for example, a module that supports a fourth generation mobile communication (4G) standard and a fifth generation mobile communication (5G) standard. The 4G standard is, for example, a 3GPP long term evolution (LTE) standard. The 5G standard is, for example, a 5G new radio (NR). The radio-frequency module 100 is a module that supports, for example, carrier aggregation and dual connectivity. Here, carrier aggregation and dual connectivity mean a communication that uses radio waves in multiple frequency bands at the same time.

The radio-frequency module 100 is, for example, configured to be capable of amplifying a transmission signal (radio-frequency signal) in a first frequency band (for example, 1710 MHz to 1980 MHz) inputted from the signal processing circuit 301 and outputting the transmission signal to an antenna A1 (hereinafter, also referred to as first antenna A1). The radio-frequency module 100 is, for example, configured to be capable of amplifying a transmission signal (radio-frequency signal) in a second frequency band (for example, 2300 MHz to 2690 MHz) inputted from the signal processing circuit 301 and outputting the transmission signal to an antenna A2 (hereinafter, also referred to as second antenna A2). The radio-frequency module 100 is configured to be capable of amplifying a reception signal (radio-frequency signal) in the first frequency band inputted from the first antenna A1 and outputting the reception signal to the signal processing circuit 301. The radio-frequency module 100 is configured to be capable of amplifying a reception signal (radio-frequency signal) in the second frequency band inputted from the second antenna A2 and outputting the reception signal to the signal processing circuit 301. The radio-frequency module 100 is configured to be capable of amplifying a reception signal (radio-frequency signal) in a third frequency band (for example, 1880 MHz to 2025 MHz) inputted from an antenna A3 (hereinafter, also referred to as third antenna A3) and outputting the reception signal to the signal processing circuit 301.

The signal processing circuit 301 is not a component element of the radio-frequency module 100 but a component element of the communication device 300 that includes the radio-frequency module 100. The radio-frequency module 100 is, for example, controlled by the signal processing circuit 301 of the communication device 300. The communication device 300 includes the radio-frequency module 100 and the signal processing circuit 301. The communication device 300 further includes the first antenna A1, the second antenna A2, and the third antenna A3. The communication device 300 further includes a circuit board on or in which the radio-frequency module 100 is mounted. The circuit board is, for example, a printed circuit board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a radio-frequency signal. The RF signal processing circuit 302, for example, performs signal processing on a radio-frequency signal (transmission signal) outputted from the baseband signal processing circuit 303 by up conversion or the like and outputs the processed radio-frequency signal to the radio-frequency module 100. The RF signal processing circuit 302, for example, performs signal processing on a radio-frequency signal (reception signal) outputted from the radio-frequency module 100 by down conversion or the like and outputs the processed radio-frequency signal to the baseband signal processing circuit 303.

The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like inputted from the outside. The baseband signal processing circuit 303 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal. A reception signal processed by the baseband signal processing circuit 303 is, for example, used to display an image as an image signal or to talk as a voice signal. The radio-frequency module 100 transmits a radio-frequency signal (a reception signal or a transmission signal) between each of the first antenna A1, the second antenna A2, and the third antenna A3 and the RF signal processing circuit 302 of the signal processing circuit 301.

The radio-frequency module 100 includes a plurality of (four in the illustrated example) transmission filters 1. The radio-frequency module 100 includes a power amplifier 3 and an output matching circuit 4. The radio-frequency module 100 includes a plurality of (six in the illustrated example) receiving filters 2. The radio-frequency module 100 includes a low-noise amplifier 18 and a plurality of (six in the illustrated example) input matching circuits 17. The radio-frequency module 100 includes a first switch 5 and a second switch 7. The radio-frequency module 100 further includes a controller 19. The radio-frequency module 100 includes a plurality of (four in the illustrated example) matching circuits 6 connected between the second switch 7 and the plurality of transmission filters 1. The radio-frequency module 100 includes a plurality of (three in the illustrated example) matching circuits 8 connected between the second switch 7 and a plurality of (three in the illustrated example) antenna terminals 91A, 91B, 91C.

The transmission filters 1 respectively have pass bands different from one another. Hereinafter, when the four transmission filters 1 are described separately, the four transmission filters 1 may also be respectively referred to as a transmission filter 11, a transmission filter 12, a transmission filter 13, and a transmission filter 14. The receiving filters 2 respectively have pass bands different from one another. Hereinafter, when the six receiving filters 2 are described separately, the six receiving filters 2 may also be respectively referred to as a receiving filter 21, a receiving filter 22, a receiving filter 23, a receiving filter 24, a receiving filter 25, and a receiving filter 26.

The radio-frequency module 100 includes a plurality of external connection terminals 9. The plurality of external connection terminals 9 includes the plurality of (three in the illustrated example) antenna terminals 91A, 91B, 91C, a signal input terminal 92, a signal output terminal 93, a control terminal 94, and a plurality of ground terminals 95 (see FIGS. 2 to 4). The plurality of ground terminals 95 is terminals electrically connected to the ground electrode of the circuit board of the communication device 300 and applied with a ground potential.

The transmission filter 11 is, for example, a filter that has a transmission band of a first communication band as a pass band. The transmission filter 12 is, for example, a filter that has a transmission band of a second communication band as a pass band. The transmission filter 13 is, for example, a filter that has a transmission band of a third communication band as a pass band. The transmission filter 14 is, for example, a filter that has a transmission band of a fourth communication band as a pass band. The first communication band is associated with a transmission signal that passes through the transmission filter 11 and is, for example, 5G NR standard n3. The second communication band is associated with a transmission signal that passes through the transmission filter 12 and is, for example, 5G NR standard n1. The third communication band is associated with a transmission signal that passes through the transmission filter 13 and is, for example, 5G NR standard n40. The fourth communication band is associated with a transmission signal that passes through the transmission filter 14 and is, for example, 5G NR standard n41. In the radio-frequency module 100 according to the first embodiment, the transmission filters 11, 12 are power class 3 transmission filters, and the transmission filters 13, 14 are power class 2 transmission filters. In other words, the transmission filters 11, 12 are first transmission filters with a relatively low power class, and the transmission filters 13, 14 are second transmission filters with a relatively high power class.

The power amplifier 3 has an input terminal and an output terminal. The power amplifier 3 amplifies transmission signals in the first frequency band and the second frequency band, inputted to the input terminal, and outputs the transmission signals from the output terminal. Here, the first frequency band includes, for example, the first communication band and the second communication band. The second frequency band includes, for example, the third communication band and the fourth communication band. The input terminal of the power amplifier 3 is connected to the signal input terminal 92. The input terminal of the power amplifier 3 is connected to the signal processing circuit 301 via the signal input terminal 92. The signal input terminal 92 is a terminal for inputting a radio-frequency signal (transmission signal) from an external circuit (for example, the signal processing circuit 301) to the radio-frequency module 100. The output terminal of the power amplifier 3 is connected to a common terminal 50 of a first switch 5 via the output matching circuit 4.

Figure 6:
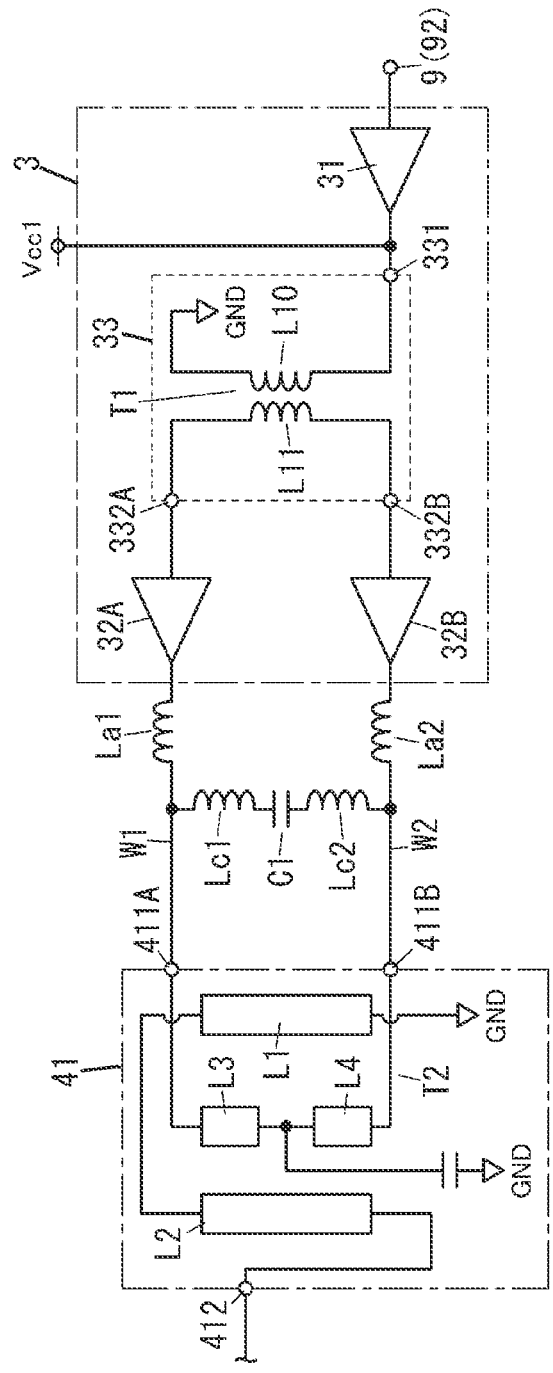
FIG. 6 is a circuit diagram of a power amplifier and part of an output matching circuit of the radio-frequency module.

For example, as shown in FIG. 6, the power amplifier 3 includes a driver stage amplifier 31, two final stage amplifiers 32A, 32B, and an unbalance-balance conversion circuit 33 (hereinafter, referred to as first balun 33) including a first transformer T1. Each of the driver stage amplifier 31, the final stage amplifier 32A, and the final stage amplifier 32B includes an amplifier transistor. The first transformer T1 includes a primary inductor L10 and a secondary inductor L11. The primary inductor L10 is connected between an unbalanced terminal 331 and a ground. The first balun 33 has the unbalanced terminal 331 and a pair of balanced terminals 332A, 332B. In the power amplifier 3, the input terminal of the driver stage amplifier 31 is connected to the signal input terminal 92, and the output terminal of the driver stage amplifier 31 is connected to the unbalanced terminal 331. In the power amplifier 3, the input terminal of the final stage amplifier 32A is connected to the balanced terminal 332A, and the input terminal of the final stage amplifier 32B is connected to the balanced terminal 332B. In the power amplifier 3, the input terminal of the driver stage amplifier 31 is an input terminal of the power amplifier 3, and the output terminal of each of the two final stage amplifiers 32A, 32B is an output terminal of the power amplifier 3. The power amplifier 3 makes up a differential amplifier circuit. A voltage Vcc1 is applied to the output terminal of the driver stage amplifier 31.

The output matching circuit 4 is provided in a signal path between the output terminal of the power amplifier 3 and the common terminal 50 of the first switch 5. The output matching circuit 4 is a circuit for matching the impedance between the power amplifier 3 and the plurality of transmission filters 1. The output matching circuit 4 includes, for example, a balance-unbalance conversion circuit 41 (hereinafter referred to as second balun 41) having a second transformer T2, and a plurality of circuit elements 42 (see FIG. 1). The second balun 41 has a pair of balanced terminals 411A, 411B and an unbalanced terminal 412. In the output matching circuit 4, the balanced terminal 411A is connected to the output terminal of the final stage amplifier 32A, the balanced terminal 411B is connected to the output terminal of the final stage amplifier 32B, and the unbalanced terminal 412 is connected to the common terminal 50 of the first switch 5. The second transformer T2 has, for example, four inductor elements L1, L2, L3, L4. In the second transformer T2, a primary inductor is made up of a series circuit of the inductor element L3 and the inductor element L4, and a secondary inductor is made up of a series circuit of the inductor element L1 and the inductor element L2. In the second transformer T2, the primary inductor is connected between the balanced terminal 411A and the balanced terminal 411B.

The radio-frequency module 100 further includes a series circuit connected between a wire W1 connecting the output terminal of the final stage amplifier 32A with the balanced terminal 411A and a wire W2 connecting the output terminal of the final stage amplifier 32B with the balanced terminal 411B. This series circuit includes an inductor Lc1, a capacitor C1, and an inductor Lc2 and is not grounded to a ground. This series circuit is an LC resonant circuit for attenuating an odd-ordered harmonic (for example, a third-order harmonic) of a radio-frequency signal (transmission signal) inputted to the power amplifier 3. The resonant frequency of the LC resonant circuit is included in a frequency band between a frequency three times the lower limit of a relatively low frequency-side frequency band of the first frequency band and the second frequency band and a frequency three times the upper limit of a relatively high frequency-side frequency band of the first frequency band and the second frequency band. The radio-frequency module 100 further includes an inductor La1 connected between the output terminal of the final stage amplifier 32A and the balanced terminal 411A, and an inductor La2 connected between the output terminal of the final stage amplifier 32B and the balanced terminal 411B.

The receiving filter 21 is, for example, a filter that has a receiving band of the first communication band as a pass band. The receiving filter 22 is, for example, a filter that has a receiving band of the second communication band as a pass band. The receiving filter 23 is, for example, a filter that has a receiving band of the third communication band as a pass band. The receiving filter 24 is, for example, a filter that has a receiving band of the fourth communication band as a pass band. The receiving filter 25 is, for example, a filter that has a receiving band of the fifth communication band as a pass band. The receiving filter 26 is, for example, a filter that has a receiving band of the sixth communication band as a pass band. The first communication band is associated with a reception signal that passes through the receiving filter 21 and is, for example, 5G NR standard n3. The second communication band is associated with a reception signal that passes through the receiving filter 22 and is, for example, 5G NR standard n1. The third communication band is associated with a reception signal that passes through the receiving filter 23 and is, for example, 5G NR standard n40. The fourth communication band is associated with a reception signal that passes through the receiving filter 24 and is, for example, 5G NR standard n41. The fifth communication band is associated with a reception signal that passes through the receiving filter 25 and is, for example, 3GPP LTE standard Band 34. The sixth communication band is associated with a reception signal that passes through the receiving filter 26 and is, for example, 3GPP LTE standard Band 39.

The low-noise amplifier 18 amplifies input reception signals in the first frequency band, the second frequency band, and the third frequency band and outputs the reception signals. The first frequency band includes, for example, the first communication band and the second communication band. The second frequency band includes, for example, the third communication band and the fourth communication band. The third frequency band includes, for example, the fifth communication band and the sixth communication band.

The low-noise amplifier 18 includes a plurality of (for example, six) amplifier transistors. Each of the plurality of amplifier transistors has an input terminal and an output terminal. The low-noise amplifier 18 amplifies a reception signal inputted to the input terminal of any one of the plurality of amplifier transistors and outputs the reception signal from the output terminal. The input terminal of each of the plurality of amplifier transistors of the low-noise amplifier 18 is connected to a corresponding one of the plurality of receiving filters 2 via a corresponding one of the plurality of input matching circuits 17. The output terminal of the low-noise amplifier 18 is connected to the signal output terminal 93. The output terminal of the low-noise amplifier 18 is, for example, connected to the signal processing circuit 301 via the signal output terminal 93. The signal output terminal 93 is a terminal for outputting a radio-frequency signal (reception signal) from the low-noise amplifier 18 to an external circuit (for example, the signal processing circuit 301).

The plurality of (for example, six) input matching circuits 17 is provided in a plurality of signal paths between the input terminals of the plurality of amplifier transistors of the low-noise amplifier 18 and the plurality of receiving filters 2. Hereinafter, when the six input matching circuits 17 are described separately, the six input matching circuits 17 may also be respectively referred to as an input matching circuit 171, an input matching circuit 172, an input matching circuit 173, an input matching circuit 174, an input matching circuit 175, and an input matching circuit 176.

The input matching circuit 171 is a circuit for matching the impedance between the low-noise amplifier 18 and the receiving filter 21. The input matching circuit 172 is a circuit for matching the impedance between the low-noise amplifier 18 and the receiving filter 22. The input matching circuit 173 is a circuit for matching the impedance between the low-noise amplifier 18 and the receiving filter 23. The input matching circuit 174 is a circuit for matching the impedance between the low-noise amplifier 18 and the receiving filter 24. The input matching circuit 175 is a circuit for matching the impedance between the low-noise amplifier 18 and the receiving filter 25. The input matching circuit 176 is a circuit for matching the impedance between the low-noise amplifier 18 and the receiving filter 26. Each of the plurality of input matching circuits 17 is made up of, for example, one inductor; however, the configuration is not limited thereto. Each of the plurality of input matching circuits 17 may include, for example, a plurality of inductors and a plurality of capacitors.

The plurality of (for example, six) input matching circuits 17 is provided in a plurality of signal paths between the input terminals of the plurality of amplifier transistors of the low-noise amplifier 18 and the plurality of receiving filters 2. Hereinafter, when the six input matching circuits 17 are described separately, the six input matching circuits 17 may also be respectively referred to as an input matching circuit 171, an input matching circuit 172, an input matching circuit 173, an input matching circuit 174, an input matching circuit 175, and an input matching circuit 176.

The input matching circuit 171 is a circuit for matching the impedance between the low-noise amplifier 18 and the receiving filter 21. The input matching circuit 172 is a circuit for matching the impedance between the low-noise amplifier 18 and the receiving filter 22. The input matching circuit 173 is a circuit for matching the impedance between the low-noise amplifier 18 and the receiving filter 23. The input matching circuit 174 is a circuit for matching the impedance between the low-noise amplifier 18 and the receiving filter 24. The input matching circuit 175 is a circuit for matching the impedance between the low-noise amplifier 18 and the receiving filter 25. The input matching circuit 176 is a circuit for matching the impedance between the low-noise amplifier 18 and the receiving filter 26. Each of the plurality of input matching circuits 17 is made up of, for example, one inductor; however, the configuration is not limited thereto. Each of the plurality of input matching circuits 17 may include, for example, a plurality of inductors and a plurality of capacitors.

The first switch 5 has the common terminal 50 and a plurality of (four in the illustrated example) selection terminals 51. Hereinafter, when the four selection terminals 51 are described separately, the four selection terminals 51 may also be respectively referred to as a selection terminal 511, a selection terminal 512, a selection terminal 513, and a selection terminal 514.

The common terminal 50 is connected to the output terminal of the power amplifier 3 via the output matching circuit 4. The selection terminal 511 is connected to the input terminal of the transmission filter 11. The selection terminal 512 is connected to the input terminal of the transmission filter 12. The selection terminal 513 is connected to the input terminal of the transmission filter 13. The selection terminal 514 is connected to the input terminal of the transmission filter 14. The first switch 5 is, for example, a switch allowed to connect at least one of the plurality of selection terminals 51 to the common terminal 50. Here, the first switch 5 is, for example, a switch capable of one-to-one connection and one-to-multiple connection.

The first switch 5 is, for example, a switch integrated circuit (IC). The first switch 5 is controlled by, for example, the signal processing circuit 301. The first switch 5 switches the connection status between the common terminal 50 and the plurality of selection terminals 51 in accordance with a control signal from the RF signal processing circuit 302 of the signal processing circuit 301. The first switch 5 may be controlled by the controller 19 instead of being controlled by the signal processing circuit 301.

The second switch 7 has a plurality of (three in the illustrated example) common terminals 70 and a plurality of (six in the illustrated example) selection terminals 71. Hereinafter, when the three common terminals 70 are described separately, the three common terminals 70 may also be respectively referred to as a common terminal 70A, a common terminal 70B, and a common terminal 70C. Hereinafter, when the six selection terminals 71 are described separately, the six selection terminals 71 may also be respectively referred to as a selection terminal 711, a selection terminal 712, a selection terminal 713, a selection terminal 714, a selection terminal 715, and a selection terminal 716.

The common terminal 70A is connected to the antenna terminal 91A. The first antenna A1 is connected to the antenna terminal 91A. The common terminal 70B is connected to the antenna terminal 91B. The second antenna A2 is connected to the antenna terminal 91B. The common terminal 70C is connected to the antenna terminal 91C. The third antenna A3 is connected to the antenna terminal 91C. The selection terminal 711 is connected to a junction point between the output terminal of the transmission filter 11 and the input terminal of the receiving filter 21. The selection terminal 712 is connected to a junction point between the output terminal of the transmission filter 12 and the input terminal of the receiving filter 22. The selection terminal 713 is connected to a junction point between the output terminal of the transmission filter 13 and the input terminal of the receiving filter 23. The selection terminal 714 is connected to a junction point between the output terminal of the transmission filter 14 and the input terminal of the receiving filter 24. The selection terminal 715 is connected to the input terminal of the receiving filter 25. The selection terminal 716 is connected to the input terminal of the receiving filter 26. The second switch 7 is, for example, allowed to connect at least one of the plurality of selection terminals 711, 712 to the common terminal 70A. The second switch 7 is, for example, allowed to connect at least one of the plurality of selection terminals 713, 714 to the common terminal 70B. The second switch 7 is, for example, allowed to connect at least one of the plurality of selection terminals 715, 716 to the common terminal 70C. Here, the second switch 7 is, for example, a switch capable of one-to-one connection and one-to-multiple connection.

The second switch 7 is, for example, a switch IC. The second switch 7 is controlled by, for example, the signal processing circuit 301. The second switch 7 switches the connection status between the plurality of common terminals 70 and the plurality of selection terminals 71 in accordance with a control signal from the RF signal processing circuit 302 of the signal processing circuit 301. The second switch 7 may be controlled by the controller 19 instead of being controlled by the signal processing circuit 301.

Hereinafter, when the four matching circuits 6 are described separately, the four matching circuits 6 may also be respectively referred to as a matching circuit 61, a matching circuit 62, a matching circuit 63, and a matching circuit 64.

The matching circuit 61 is connected between the selection terminal 711 of the second switch 7 and the junction point between the output terminal of the transmission filter 11 and the input terminal of the receiving filter 21. The matching circuit 62 is connected between the selection terminal 712 of the second switch 7 and the junction point between the output terminal of the transmission filter 12 and the input terminal of the receiving filter 22. The matching circuit 63 is connected between the selection terminal 713 of the second switch 7 and the junction point between the output terminal of the transmission filter 13 and the input terminal of the receiving filter 23. The matching circuit 64 is connected between the selection terminal 714 of the second switch 7 and the junction point between the output terminal of the transmission filter 14 and the input terminal of the receiving filter 24. Each of the plurality of matching circuits 6 is made up of, for example, one inductor; however, the configuration is not limited thereto. Each of the plurality of matching circuits 6 may include, for example, a plurality of inductors and a plurality of capacitors.

Hereinafter, when the three matching circuits 8 are described separately, the three matching circuits 8 may also be respectively referred to as a matching circuit 81, a matching circuit 82, and a matching circuit 83.

The matching circuit 81 is connected between the antenna terminal 91A and the common terminal 70A of the second switch 7. The matching circuit 82 is connected between the antenna terminal 91B and the common terminal 70B of the second switch 7. The matching circuit 83 is connected between the antenna terminal 91C and the common terminal 70C of the second switch 7. Each of the plurality of matching circuits 8 is made up of, for example, one inductor; however, the configuration is not limited thereto. Each of the plurality of matching circuits 8 may include, for example, a plurality of inductors and a plurality of capacitors.

The controller 19 is connected to the control terminal 94. The control terminal 94 is connected to, for example, the signal processing circuit 301. The controller 19 controls the power amplifier 3 in accordance with a control signal from the signal processing circuit 301.

(1.2) Structure of Radio-Frequency Module

Next, the structure of the radio-frequency module 100 according to the first embodiment will be described with reference to FIGS. 1 to 4.

As shown in FIGS. 1 to 4, the radio-frequency module 100 includes the mounting substrate 130 and the four transmission filters 1. The radio-frequency module 100 includes the power amplifier 3 and the output matching circuit 4. The radio-frequency module 100 includes the six receiving filters 2, the low-noise amplifier 18, the six input matching circuits 17, the first switch 5, the second switch 7, and the controller 19. The radio-frequency module 100 includes the four matching circuits 6 (hereinafter, also referred to as first matching circuits 6) and the three matching circuits 8 (hereinafter, also referred to as second matching circuits 8). The radio-frequency module 100 includes the plurality of external connection terminals 9. The radio-frequency module 100 further includes the first resin layer (resin layer) 15, a second resin layer 20, and the shield layer 16.

The mounting substrate 130 has the first major surface 131 and the second major surface 132 opposite to each other in the thickness direction D1 of the mounting substrate 130. The mounting substrate 130 is, for example, a multilayer substrate that includes a plurality of dielectric layers and a plurality of electrically conductive layers. The plurality of dielectric layers and the plurality of electrically conductive layers are laminated in the thickness direction D1 of the mounting substrate 130. The plurality of electrically conductive layers each is formed in a predetermined pattern determined layer by layer. Each of the plurality of electrically conductive layers includes one or more conductor portions in a plane orthogonal to the thickness direction D1 of the mounting substrate 130. The material of each electrically conductive layer is, for example, copper. The plurality of electrically conductive layers includes a ground layer. In the radio-frequency module 100, the plurality of ground terminals 95 (see FIGS. 3 and 4) and the ground layer are electrically connected via a via conductor or the like of the mounting substrate 130. The mounting substrate 130 is, for example, a low temperature co-fired ceramics (LTCC) substrate. The mounting substrate 130 is not limited to an LTCC substrate. The mounting substrate 130 may be, for example, a printed circuit board, a high temperature co-fired ceramics (HTCC) substrate, or a resin multilayer substrate.

The mounting substrate 130 is not limited to an LTCC substrate and may be, for example, a wiring structure. The wiring structure is, for example, a multilayer structure. The multilayer structure includes at least one electrically insulating layer and at least one electrically conductive layer.

The electrically insulating layer is formed in a predetermined pattern. When the number of the electrically insulating layers is multiple, each of the multiple electrically insulating layers is formed in a predetermined pattern determined layer by layer. The electrically conductive layer is formed in a predetermined pattern different from the predetermined pattern of the electrically insulating layer. When the number of the electrically conductive layers is multiple, each of the multiple electrically conductive layers is formed in a predetermined pattern determined layer by layer. The electrically conductive layer may include one or more rewiring portions. In the wiring structure, of two surfaces opposite to each other in the thickness direction of the multilayer structure, a first surface is the first major surface 131 of the mounting substrate 130, and a second surface is the second major surface 132 of the mounting substrate 130. The wiring structure may be, for example, an interposer. The interposer may be an interposer using a silicon substrate or may be a substrate made up of multiple layers.

The first major surface 131 and the second major surface 132 of the mounting substrate 130 are spaced apart in the thickness direction D1 of the mounting substrate 130 and intersect with the thickness direction D1 of the mounting substrate 130. The first major surface 131 of the mounting substrate 130 is, for example, orthogonal to the thickness direction D1 of the mounting substrate 130. The first major surface 131 may include, for example, the side surface or the like of the conductor portion as a surface not orthogonal to the thickness direction D1. The second major surface 132 of the mounting substrate 130 is, for example, orthogonal to the thickness direction D1 of the mounting substrate 130. The second major surface 132 may include, for example, the side surface or the like of the conductor portion as a surface not orthogonal to the thickness direction D1. The first major surface 131 and the second major surface 132 of the mounting substrate 130 may have minute irregularities or a recessed portion or a protruding portion. When, for example, the first major surface 131 of the mounting substrate 130 has a recessed portion, the inner surface of the recessed portion is included in the first major surface 131. The mounting substrate 130 has a rectangular shape in plan view in the thickness direction D1 of the mounting substrate 130; however, the configuration is not limited thereto. The mounting substrate 130 may have, for example, a square shape.

In the radio-frequency module 100 according to the first embodiment, the circuit components of a first group are mounted on the first major surface 131 of the mounting substrate 130. As shown in FIG. 1, the circuit components of the first group include the four transmission filters 1, the six receiving filters 2, the power amplifier 3, five circuit elements 42 of the output matching circuit 4, the six input matching circuits 17, the four first matching circuits 6, and the three second matching circuits 8. Here, the phrase "the circuit components are mounted on the first major surface 131 of the mounting substrate 130" includes not only a structure that the circuit components are disposed on (mechanically connected to) the first major surface 131 of the mounting substrate 130 but also the circuit components are electrically connected to (appropriate conductor portions of) the mounting substrate 130. In the radio-frequency module 100, the circuit components of a second group are mounted on the second major surface 132 of the mounting substrate 130. The circuit components of the second group include the first switch 5, the second switch 7, the controller 19, and the low-noise amplifier 18. Here, the phrase "the circuit components are mounted on the second major surface 132 of the mounting substrate 130" includes not only a structure that the circuit components are disposed on (mechanically connected to) the second major surface 132 of the mounting substrate 130 but also the circuit components are electrically connected to (appropriate conductor portions of) the mounting substrate 130. The second balun 41 of the output matching circuit 4 is provided on the mounting substrate 130.

Each of the plurality of transmission filters 1 and the plurality of receiving filters 2 is, for example, a ladder filter. Each of the plurality of transmission filters 1 and the plurality of receiving filters 2 has a plurality of (for example, four) series arm resonators and a plurality of (for example, three) parallel arm resonators.

Each of the plurality of transmission filters 1 and the plurality of receiving filters 2 is, for example, an acoustic wave filter. The acoustic wave filter is configured such that each of a plurality of series arm resonators and a plurality of parallel arm resonators is made up of an acoustic wave resonator. The acoustic wave filter is, for example, a surface acoustic wave filter that uses surface acoustic waves.

In the surface acoustic wave filter, each of the plurality of series arm resonators and the plurality of parallel arm resonators is, for example, a surface acoustic wave (SAW) resonator.

A surface acoustic wave filter has, for example, a piezoelectric substrate, a plurality of interdigital transducer (IDT) electrodes formed on the piezoelectric substrate and provided in a one-to-one correspondence with a plurality of series arm resonators, and a plurality of interdigital transducer electrodes formed on the piezoelectric substrate and provided in a one-to-one correspondence with a plurality of parallel arm resonators. The piezoelectric substrate is, for example, a piezoelectric substrate. The piezoelectric substrate is, for example, a lithium niobate substrate, a lithium tantalate substrate, or a quartz crystal substrate. The piezoelectric substrate is not limited to the piezoelectric substrate. The piezoelectric substrate may be, for example, a multilayer substrate including a silicon substrate, a high acoustic velocity film on the silicon substrate, a low acoustic velocity film on the high acoustic velocity film, and a piezoelectric layer on the low acoustic velocity film. In the multilayer substrate, the material of the piezoelectric layer is, for example, lithium niobate or lithium tantalate. The low acoustic velocity film is a film through which a bulk wave propagates at an acoustic velocity lower than a bulk wave propagates through the piezoelectric layer. The material of the low acoustic velocity film is, for example, silicon oxide. The high acoustic velocity film is a film through which a bulk wave propagates at an acoustic velocity higher than an acoustic wave propagates through the piezoelectric layer. The material of the high acoustic velocity film is, for example, silicon nitride.

In plan view in the thickness direction D1 of the mounting substrate 130, the outer peripheral shape of each of the plurality of transmission filters 1 and the plurality of receiving filters 2 is a rectangular shape.

The power amplifier 3 is a power amplifier IC chip including a circuit portion having the driver stage amplifier 31, the two final stage amplifiers 32A, 32B, and the first balun 33. The power amplifier 3 is flip-chip mounted on the first major surface 131 of the mounting substrate 130. In plan view in the thickness direction D1 of the mounting substrate 130, the outer peripheral shape of the power amplifier 3 is a rectangular shape. Each of the driver stage amplifier 31, the final stage amplifier 32A, and the final stage amplifier 32B includes an amplifier transistor. The amplifier transistor is, for example, a heterojunction bipolar transistor (HBT). In this case, the power amplifier IC chip that makes up the power amplifier 3 is, for example, a GaAs IC chip. The amplifier transistor is not limited to a bipolar transistor, such as a HBT, and may be, for example, a field effect transistor (FET). The FET is, for example, metal-oxide-semiconductor field effect transistor (MOSFET). The power amplifier IC chip that makes up the power amplifier 3 is not limited to a GaAs IC chip and may be, for example, an Si IC chip, an SiGe IC chip, or a GaN IC chip.

The second balun 41 of the output matching circuit 4 is provided on the mounting substrate 130. As described above, the second balun 41 has the plurality of inductor elements L1 to L4. The inductor elements L3, L4 are provided in the mounting substrate 130. The inductor element L1 is provided on the first major surface 131 of the mounting substrate 130 so as to overlap the inductor elements L3, L4 in plan view in the thickness direction D1 of the mounting substrate 130. The inductor element L2 is provided in the mounting substrate 130 so as to overlap the inductor elements L3, L4 in plan view in the thickness direction D1 of the mounting substrate 130. In the thickness direction D1 of the mounting substrate 130, the inductor element L2 is located on an opposite side to the inductor element L1 when viewed from the inductor elements L3, L4.

The five circuit elements 42 of the output matching circuit 4 each are an inductor or a capacitor. In plan view in the thickness direction D1 of the mounting substrate 130, the circuit element 42 disposed between the two transmission filters 1 (transmission filters 11, 12) is, for example, an inductor.

In FIG. 1, the LC resonant circuit is not shown; however, the capacitor C1 of the LC resonant circuit is mounted on the first major surface 131 of the mounting substrate 130. The inductors Lc1, Lc2 of the LC resonant circuit are provided on the mounting substrate 130.

Figure 2:
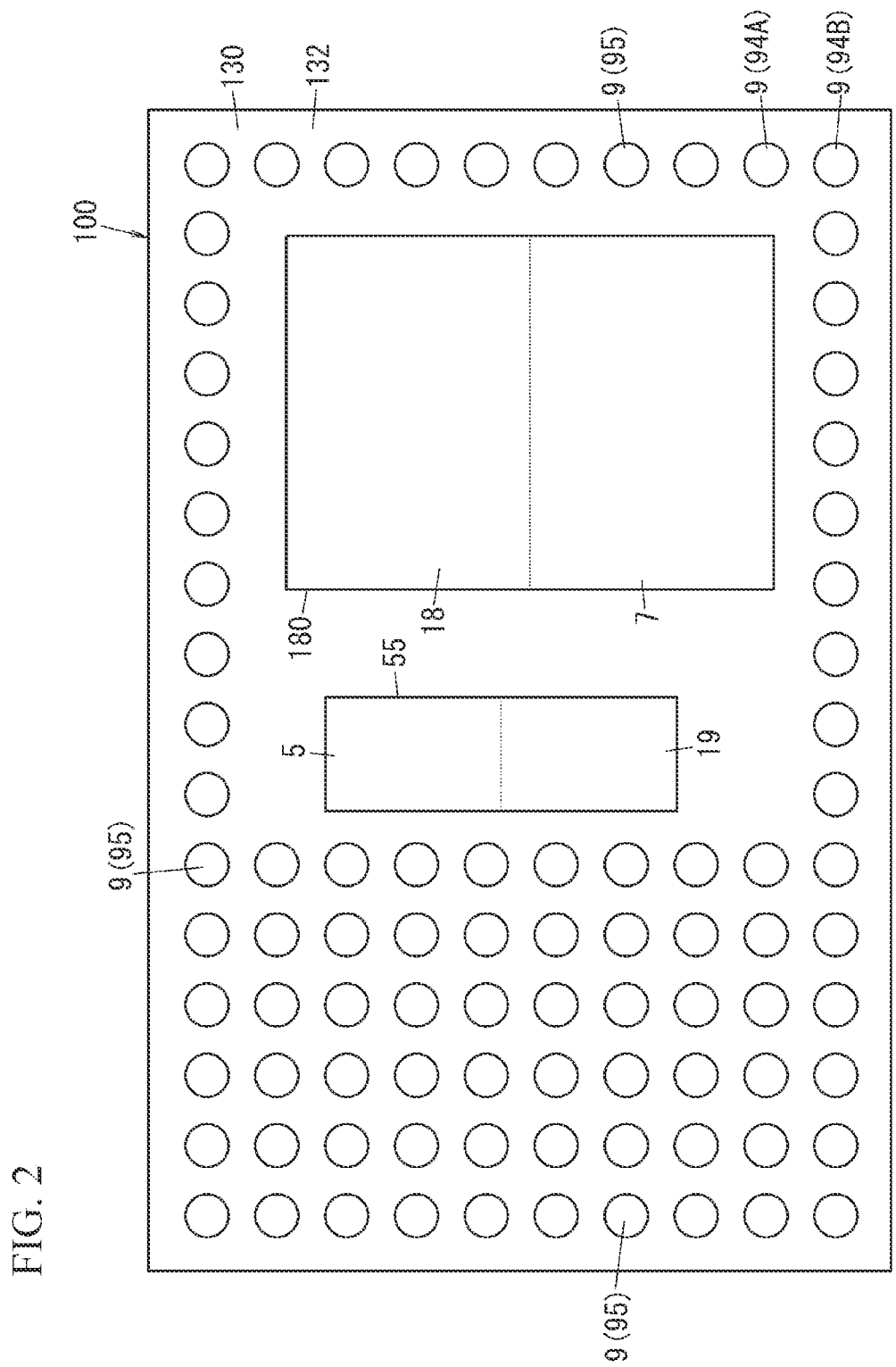
FIG. 2 is a plan view that relates to the radio-frequency module and that shows a second major surface of a mounting substrate and circuit components and a plurality of external connection terminals disposed on a second major surface of the mounting substrate when seen through from the first major surface side of the mounting substrate.
Figure 3:
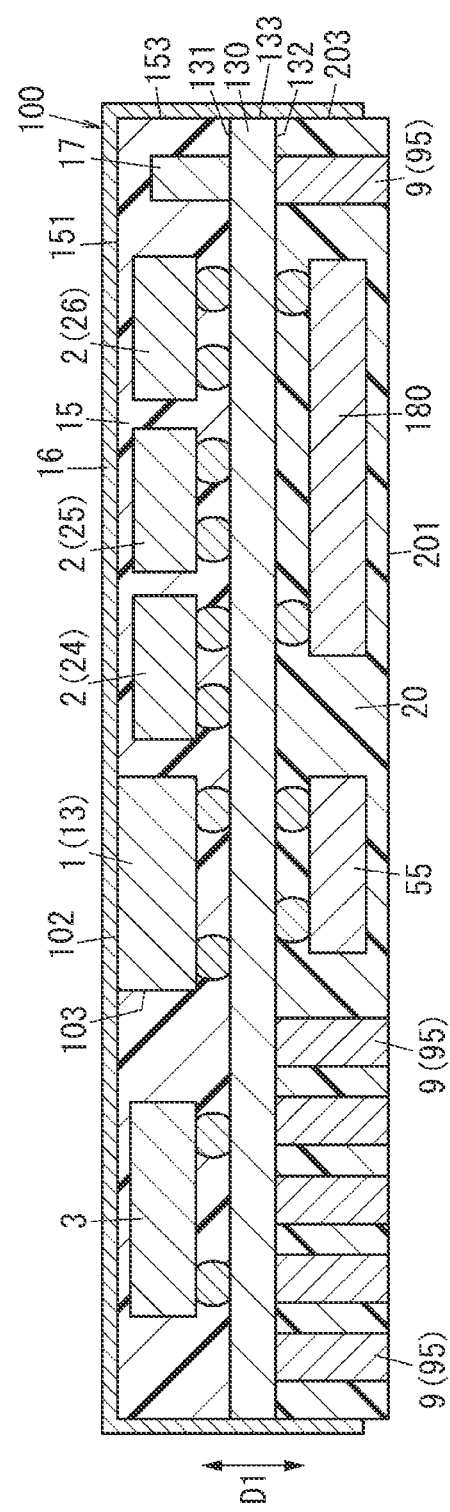
FIG. 3 is a cross-sectional view of the radio-frequency module, taken along the line X-X in FIG. 1.

As shown in FIG. 2, the low-noise amplifier 18 is mounted on the second major surface 132 of the mounting substrate 130. In the radio-frequency module 100 according to the first embodiment, an IC chip 180 (hereinafter, also referred to as first IC chip 180) including the low-noise amplifier 18 and the second switch 7 is mounted on the second major surface 132 of the mounting substrate 130. Here, the first IC chip 180 is flip-chip mounted on the second major surface 132 of the mounting substrate 130. In plan view in the thickness direction D1 of the mounting substrate 130, the outer peripheral shape of the first IC chip 180 is a rectangular shape. The six amplifier transistors of the low-noise amplifier 18 are field effect transistors; however, the configuration is not limited thereto. The six amplifier transistors of the low-noise amplifier 18 may be, for example, bipolar transistors. The first IC chip 180 is an Si IC chip; however, the configuration is not limited thereto.

The circuit component (inductor) of each of the six input matching circuits 17 is, for example, a chip inductor. The circuit component of each of the six input matching circuits 17 is, for example, mounted on the first major surface 131 of the mounting substrate 130. In plan view in the thickness direction D1 of the mounting substrate 130, the outer peripheral shape of the circuit component of each of the six input matching circuits 17 is a rectangular shape. Each of the six input matching circuits 17 may include an internal layer inductor provided in the mounting substrate 130.

As shown in FIG. 2, the first switch 5 is mounted on the second major surface 132 of the mounting substrate 130. In the radio-frequency module 100 according to the first embodiment, an IC chip 55 (hereinafter, also referred to as second IC chip 55) including the first switch 5 and the controller 19 is mounted on the second major surface 132 of the mounting substrate 130. Here, the second IC chip 55 is flip-chip mounted on the second major surface 132 of the mounting substrate 130. In plan view in the thickness direction D1 of the mounting substrate 130, the outer peripheral shape of the second IC chip 55 is a rectangular shape. The second IC chip 55 is an Si IC chip; however, the configuration is not limited thereto.

The circuit component (inductor) of each of the four first matching circuits 6 is, for example, a chip inductor. The circuit component of each of the four first matching circuits 6 is, for example, mounted on the first major surface 131 of the mounting substrate 130. In plan view in the thickness direction D1 of the mounting substrate 130, the outer peripheral shape of the circuit component of each of the four first matching circuits 6 is a rectangular shape. Each of the four first matching circuits 6 may include an internal layer inductor provided in the mounting substrate 130.

The circuit component (inductor) of each of the three second matching circuits 8 is, for example, a chip inductor. The circuit component of each of the three second matching circuits 8 is, for example, mounted on the first major surface 131 of the mounting substrate 130. In plan view in the thickness direction D1 of the mounting substrate 130, the outer peripheral shape of the circuit component of each of the three second matching circuits 8 is a rectangular shape. Each of the three second matching circuits 8 may include an internal layer inductor provided in the mounting substrate 130.

The plurality of external connection terminals 9 is disposed on the second major surface 132 of the mounting substrate 130. Here, the phrase "the external connection terminals 9 are disposed on the second major surface 132 of the mounting substrate 130" includes not only the structure that the external connection terminals 9 are mechanically connected to the second major surface 132 of the mounting substrate 130 but also the structure that the external connection terminals 9 are electrically connected to (appropriate conductor portions of) the mounting substrate 130. The material of the plurality of external connection terminals 9 is, for example, metal (for example, copper, copper alloy, or the like). Each of the plurality of external connection terminals 9 is a columnar electrode. The columnar electrode is, for example, a cylindrical electrode. The plurality of external connection terminals 9 is bonded to the conductor portions of the mounting substrate 130 by, for example, solder; however, the configuration is not limited thereto. The plurality of external connection terminals 9 may be bonded by using, for example, an electrically conductive adhesive (for example, electrically conductive paste) or may be directly bonded.

As described above, the plurality of external connection terminals 9 includes the three antenna terminals 91A, 91B, 91C, the signal input terminal 92, the signal output terminal 93, the control terminal 94, and the plurality of ground terminals 95. The plurality of ground terminals 95 is electrically connected to the ground layer of the mounting substrate 130. The ground layer is a circuit ground of the radio-frequency module 100. The plurality of circuit components of the radio-frequency module 100 includes circuit components electrically connected to the ground layer.

The first resin layer 15 covers each of the circuit components of the first group, mounted on the first major surface 131 of the mounting substrate 130, on the first major surface 131 side of the mounting substrate 130. The first resin layer 15 includes resin (for example, epoxy resin). The first resin layer 15 may include a filler in addition to resin.

The second resin layer 20 covers each of the circuit components of the second group, mounted on the second major surface 132 of the mounting substrate 130, and the outer peripheral surface of each of the plurality of external connection terminals 9, on the second major surface 132 side of the mounting substrate 130. The second resin layer 20 includes resin (for example, epoxy resin). The second resin layer 20 may include a filler in addition to resin. The material of the second resin layer 20 may be the same material as the material of the first resin layer 15 or may be a different material.

Figure 4:
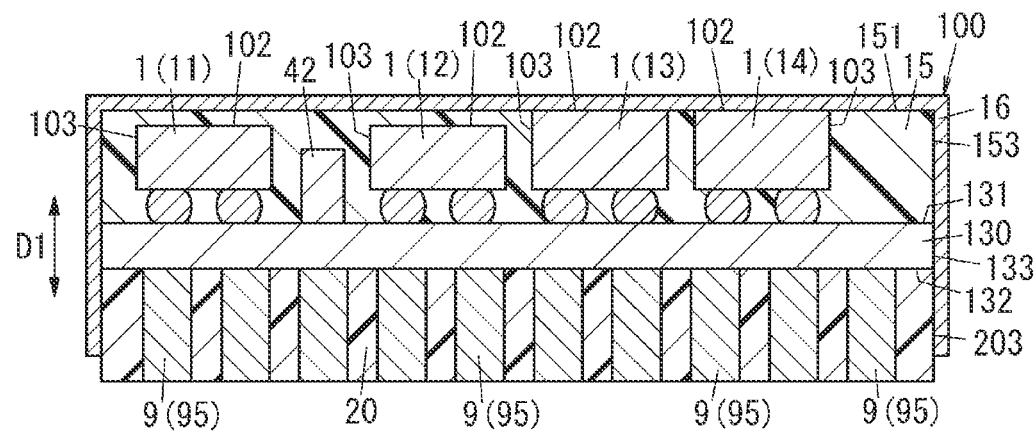
FIG. 4 is a cross-sectional view of the radio-frequency module, taken along the line Y-Y in FIG. 1.

The shield layer 16 covers the first resin layer 15 and the four transmission filters 1. As shown in FIG. 4, of the four transmission filters 1, the major surface 102 of each of the two transmission filters 13, 14 on an opposite side to the mounting substrate 130 side is in contact with the shield layer 16. The shield layer 16 has an electrical conductivity. The shield layer 16 has a multilayer structure in which a plurality of metal layers is laminated; however, the configuration is not limited thereto. The shield layer 16 may be a single metal layer. The metal layer includes one or more types of metals. The shield layer 16 covers a major surface 151 of the first resin layer 15 on an opposite side to the mounting substrate 130 side, an outer peripheral surface 153 of the first resin layer 15, and an outer peripheral surface 133 of the mounting substrate 130. The shield layer 16 also covers an outer peripheral surface 203 of the second resin layer 20. The shield layer 16 is in contact with at least part of the outer peripheral surface of the ground layer of the mounting substrate 130. Thus, the potential of the shield layer 16 can be set to the same potential as the potential of the ground layer.

(1.3) Layout of Circuit Components in Radio-Frequency Module

Next, the layout of the circuit components in the radio-frequency module 100 according to the first embodiment will be described with reference to FIGS. 1 to 4.

In the radio-frequency module 100, in plan view in the thickness direction D1 of the mounting substrate 130, in a direction (up and down direction in FIG. 1) parallel to the direction in which the output matching circuit 4 and the power amplifier 3 are arranged, the plurality of transmission filters 1 is arranged from the output matching circuit 4 side (upper side) in order of the transmission filter 11, the transmission filter 12, the transmission filter 13, and the transmission filter 14.

In the radio-frequency module 100, in plan view in the thickness direction D1 of the mounting substrate 130, the four transmission filters 1 are located between the output matching circuit 4 and the six input matching circuits 17.

In the radio-frequency module 100, in plan view in the thickness direction D1 of the mounting substrate 130, the four transmission filters 1 are located between the output matching circuit 4 and the six first matching circuits 6.

In the radio-frequency module 100, in plan view in the thickness direction D1 of the mounting substrate 130, the four transmission filters 1 are located between the output matching circuit 4 and the three second matching circuits 8.

In the radio-frequency module 100, the first IC chip 180 does not overlap the plurality of transmission filters 1 in plan view in the thickness direction D1 of the mounting substrate 130.

In the radio-frequency module 100, at least one (two in the illustrated example) of the plurality of transmission filters 1) overlaps the second IC chip 55 in plan view in the thickness direction D1 of the mounting substrate 130. In plan view in the thickness direction D1 of the mounting substrate 130, part of each of the transmission filters 12, 13 overlaps part of the second IC chip 55; however, the configuration is not limited thereto. The entire part of each of the transmission filters 12, 13 may overlap part of the second IC chip 55. The entire part of each of the transmission filters 12, 13 may overlap the entire part of the second IC chip 55.

In the radio-frequency module 100, the power amplifier 3 does not overlap the low-noise amplifier 18 in plan view in the thickness direction D1 of the mounting substrate 130.

The circuit configuration of the radio-frequency module 100 has a transmitting circuit for transmitting a transmission signal and a receiving circuit for receiving a reception signal. In the radio-frequency module 100, of the plurality of circuit components, circuit components included only in the transmitting circuit do not overlap the other circuit components (circuit components included only in the receiving circuit and circuit components shared between the transmitting circuit and the receiving circuit) in the thickness direction D1 of the mounting substrate 130. Of the plurality of circuit components, a group of the circuit components included only in the transmitting circuit includes the four transmission filters 1, the power amplifier 3, the output matching circuit 4, and the second IC chip 55. Of the plurality of circuit components, a group of the circuit components included only in the receiving circuit includes the six receiving filters 2, the six input matching circuits 17, and the low-noise amplifier 18. A group of the circuit components shared between the transmitting circuit and the receiving circuit includes the second switch 7, the four first matching circuits 6, and the three second matching circuits 8.

In plan view in the thickness direction D1 of the mounting substrate 130, the radio-frequency module 100 is divided into a first region and a second region. In the first region, a group of circuit components included only in the transmitting circuit of the plurality of circuit components is disposed. In the second region, a group of circuit components included only in the receiving circuit and a group of circuit components shared between the transmitting circuit and the receiving circuit are disposed.

(1.4) Manufacturing Method for Radio-Frequency Module

Next, a manufacturing method for the radio-frequency module 100 according to the first embodiment will be described.

The manufacturing method for the radio-frequency module 100 may adopt, for example, a manufacturing method including a first process, a second process, a third process, a fourth process, and a fifth process. The first process is a process in which the plurality of circuit components is mounted on the mounting substrate 130 and the plurality of external connection terminals 9 is disposed. The second process is a process in which a first resin material layer that covers the plurality of transmission filters 1 and the like and that is a source of the first resin layer 15 is formed on the first major surface 131 side of the mounting substrate 130 and a second resin material layer that is a source of the second resin layer 20 is formed on the second major surface 132 side of the mounting substrate 130. The third process is a process in which the first resin layer 15 is formed and the thickness of each of the piezoelectric substrates is reduced by grinding the first resin material layer from the major surface of the first resin material layer on an opposite side to the mounting substrate 130 side to expose the piezoelectric substrates of the two transmission filters 13, 14 of the plurality of transmission filters 1, and then grinding the first resin material layer and the piezoelectric substrates. The fourth process is a process in which the second resin layer 20 is formed by grinding the second resin material layer from the major surface of the second resin material layer on an opposite side to the mounting substrate 130 side to expose the distal ends of the plurality of external connection terminals 9 and then grinding the second resin material layer and the external connection terminals 9. The fifth process is a process in which the shield layer 16 that is in contact with the major surface 151 of the first resin layer 15 and the major surface 102 of each of the two transmission filters 13, 14 of the plurality of transmission filters 1 on an opposite side to the mounting substrate 130 side is formed by, for example, sputtering, vapor deposition, or printing.

(2) Advantageous Effects (2.1) Radio-Frequency Module

The radio-frequency module 100 according to the first embodiment includes a mounting substrate 130, first transmission filters 11, 12, second transmission filters 13, 14, a resin layer 15, and a shield layer 16. The mounting substrate 130 has a first major surface 131 and a second major surface 132 opposite to each other. The first transmission filters 11, 12 are mounted on the first major surface 131 of the mounting substrate 130. The second transmission filters 13, 14 are mounted on the first major surface 131 of the mounting substrate 130 and are higher in power class than the first transmission filters 11, 12. The resin layer 15 is disposed on the first major surface 131 of the mounting substrate 130. The shield layer 16 covers at least part of the resin layer 15. The resin layer 15 covers at least part of an outer peripheral surface 103 of each of the first transmission filters 11, 12 and covers at least part of an outer peripheral surface 103 of each of the second transmission filters 13, 14. The shield layer 16 overlaps at least part of each of the second transmission filters 13, 14 in plan view in a thickness direction D1 of the mounting substrate 130. At least part of a major surface 102 of each of the second transmission filters 13, 14 on an opposite side to the mounting substrate 130 side is in contact with the shield layer 16. In other words, at least part of an area covered with the shield layer 16 on the major surface 102 of each of the second transmission filters 13, 14 on an opposite side to the mounting substrate 130 side is in contact with the shield layer 16.

The radio-frequency module 100 according to the first embodiment includes a mounting substrate 130, transmission filters 13, 14, a resin layer 15, and a shield layer 16. The mounting substrate 130 has a first major surface 131 and a second major surface 132 opposite to each other. Each of the transmission filters 13, 14 is at least one transmission filter of a power class 1 transmission filter and a power class 2 transmission filter, mounted on the first major surface 131 of the mounting substrate 130. The resin layer 15 is disposed on the first major surface 131 of the mounting substrate 130. The shield layer 16 covers at least part of the resin layer 15. The resin layer 15 covers at least part of an outer peripheral surface 103 of each of the transmission filters 13, 14. The shield layer 16 overlaps at least part of each of the transmission filters 13, 14 in plan view in a thickness direction D1 of the mounting substrate 130. At least part of a major surface 102 of each of the transmission filters 13, 14 on an opposite side to the mounting substrate 130 side is in contact with the shield layer 16. In other words, at least part of an area covered with the shield layer 16 on the major surface 102 of each of the transmission filters 13, 14 on an opposite side to the mounting substrate 130 side is in contact with the shield layer 16.

In the radio-frequency module 100 according to the first embodiment, as described above, at least part of the major surface 102 of each of the (second) transmission filters 13, 14 on an opposite side to the mounting substrate 130 side is in contact with the shield layer 16. Therefore, the heat generated in the (second) transmission filters 13, 14 can be dissipated through the shield layer 16. Thus, it is possible to improve the heat dissipation capability. The radio-frequency module 100 according to the first embodiment is capable of stabilizing the temperature characteristics of an acoustic wave filter that makes up each of the (second) transmission filters 13, 14 and is capable of stabilizing the characteristics of the radio-frequency module 100.

In the radio-frequency module 100 according to the first embodiment, the major surface 102 of each of the transmission filters 11, 12 with a relatively low power class on an opposite side to the mounting substrate 130 side is not in contact with the shield layer 16. Thus, a printable area on the radio-frequency module 100 is increased. In addition, the thickness of the piezoelectric substrate of each of the transmission filters 11, 12 does not need to be increased by not bringing the major surface 102 of each of the transmission filters 11, 12 into contact with the shield layer 16, so an increase in the material cost is suppressed.

In the radio-frequency module 100 according to the first embodiment, from the viewpoint of improving the heat dissipation capability, the shield layer 16 is preferably in contact with the entire area of the major surface 102 of each of the transmission filters 13, 14 of the plurality of transmission filters 1 on an opposite side to the mounting substrate 130 side. However, the condition that the shield layer 16 is in contact with the entire surface of the major surface 102 of each of the transmission filters 13, 14 is not indispensable.

(2.2) Communication Device

The communication device 300 according to the first embodiment includes a signal processing circuit 301 and the radio-frequency module 100. The signal processing circuit 301 is connected to the radio-frequency module 100.

The communication device 300 according to the first embodiment includes the radio-frequency module 100, so it is possible to improve the heat dissipation capability.

A plurality of electronic components that make up the signal processing circuit 301 may be mounted on, for example, the above-described circuit board or may be mounted on a circuit board (second circuit board) different from the circuit board (first circuit board) on which the radio-frequency module 100 is mounted.

(3) Modifications (3.1) First Modification

Figure 7:
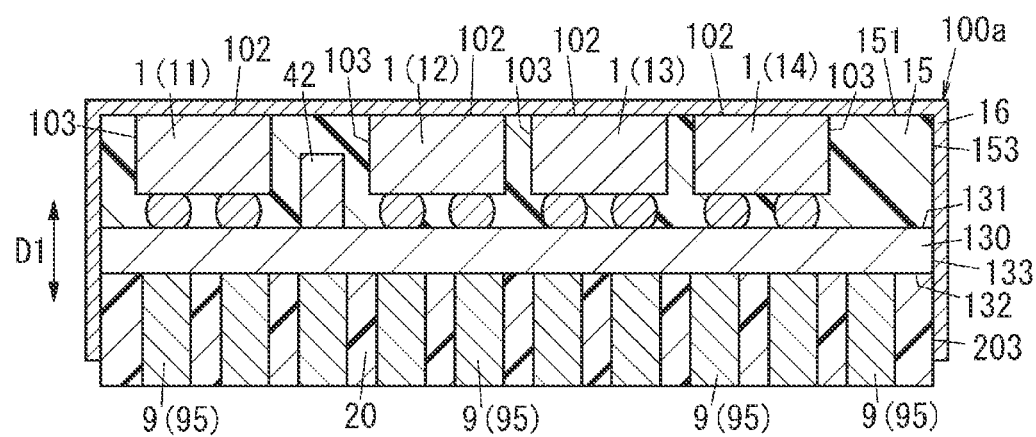
FIG. 7 is a cross-sectional view of a radio-frequency module according to a first modification of the first embodiment.

A radio-frequency module 100a according to a first modification of the first embodiment will be described with reference to FIG. 7. For the radio-frequency module 100a according to the first modification, like reference signs denote component elements similar to those of the radio-frequency module 100 according to the first embodiment, and the description is omitted. The circuit configuration of the radio-frequency module 100a is similar to the circuit configuration of the radio-frequency module 100 according to the first embodiment described with reference to FIGS. 5 and 6.

The radio-frequency module 100a according to the first modification differs from the radio-frequency module 100 according to the first embodiment in that the major surface 102 of each of the power class 3 transmission filters 11, 12 on an opposite side to the mounting substrate 130 side is in contact with the shield layer 16.

In the radio-frequency module 100a according to the first modification, as in the case of the radio-frequency module 100 according to the first embodiment, the major surface 102 of each of the power class 2 transmission filters 13, 14 on an opposite side to the mounting substrate 130 side is in contact with the shield layer 16, so it is possible to improve the heat dissipation capability.

In the radio-frequency module 100a according to the first modification, the major surface 102 of each of the power class 3 transmission filters 11, 12 on an opposite side to the mounting substrate 130 side is also in contact with the shield layer 16, so it is possible to further improve the heat dissipation capability.

(3.2) Second Modification

Figure 8:
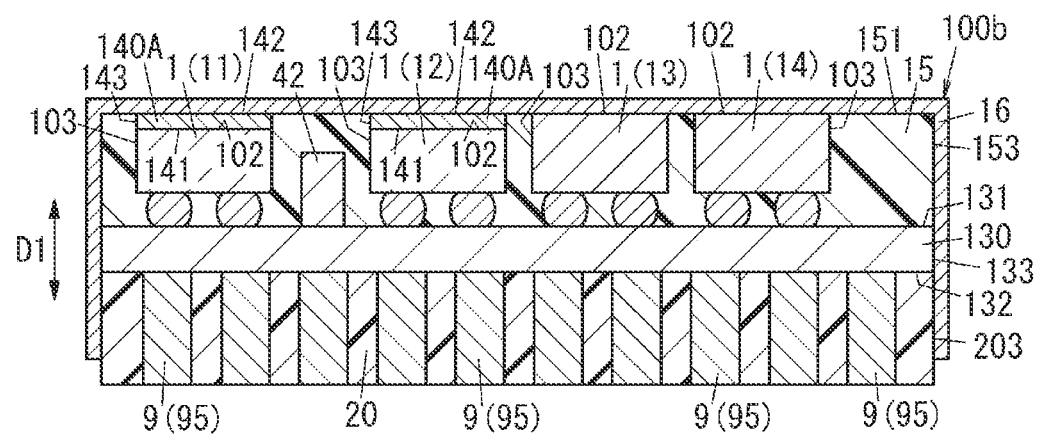
FIG. 8 is a cross-sectional view of a radio-frequency module according to a second modification of the first embodiment.

A radio-frequency module 100b according to a second modification of the first embodiment will be described with reference to FIG. 8. For the radio-frequency module 100b according to the second modification, like reference signs denote component elements similar to those of the radio-frequency module 100 according to the first embodiment, and the description is omitted. The circuit configuration of the radio-frequency module 100b is similar to the circuit configuration of the radio-frequency module 100 according to the first embodiment described with reference to FIGS. 5 and 6.

The radio-frequency module 100b according to the second modification differs from the radio-frequency module 100 according to the first embodiment in that the radio-frequency module 100b includes contact members 140A respectively disposed on the major surfaces 102 of the power class 3 transmission filters 11, 12 on an opposite side to the mounting substrate 130 side.

In plan view in the thickness direction D1 of the mounting substrate 130, each of the plurality of contact members 140A has a rectangular shape; however, the configuration is not limited thereto. In plan view in the thickness direction D1 of the mounting substrate 130, each of the plurality of contact members 140A has the same size as a corresponding one of the transmission filters 1, with which the contact member 140A contacts; however, the configuration is not limited thereto. Each of the plurality of contact members 140A may be larger than or may be smaller than a corresponding one of the transmission filters 1, with which the contact member 140A contacts. The material of the plurality of contact members 140A is, for example, copper or copper alloy. The plurality of contact members 140A may be respectively bonded to the major surfaces 102 of the transmission filters 1 or may be just respectively in contact with the major surfaces 102. The materials of the plurality of contact members 140A are preferably the same and may be different from each other.

In the radio-frequency module 100b according to the second modification, as in the case of the radio-frequency module 100 according to the first embodiment, the major surface 102 of each of the power class 2 transmission filters 13, 14 on an opposite side to the mounting substrate 130 side is in contact with the shield layer 16, so it is possible to improve the heat dissipation capability.

In the radio-frequency module 100b according to the second modification, the major surface 102 of each of the power class 3 transmission filters 11, 12 on an opposite side to the mounting substrate 130 side is in contact with the shield layer 16 with the contact member 140A interposed therebetween, so it is possible to further improve the heat dissipation capability.

(3.3) Third Modification

Figure 9:
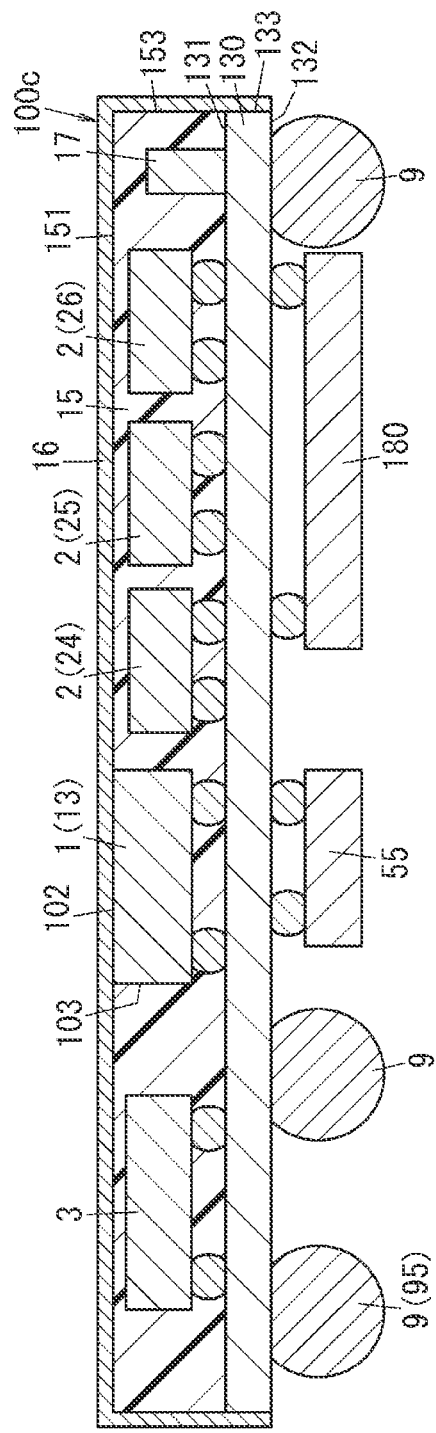
FIG. 9 is a cross-sectional view of a radio-frequency module according to a third modification of the first embodiment.

A radio-frequency module 100c according to a third modification of the first embodiment will be described with reference to FIG. 9. For the radio-frequency module 100c according to the third modification, like reference signs denote component elements similar to those of the radio-frequency module 100 according to the first embodiment, and the description is omitted. The circuit configuration of the radio-frequency module 100c is similar to the circuit configuration of the radio-frequency module 100 according to the first embodiment described with reference to FIGS. 5 and 6.

The radio-frequency module 100c according to the third modification differs from the radio-frequency module 100 according to the first embodiment in that the plurality of external connection terminals 9 is ball bumps. The radio-frequency module 100c according to the third modification differs from the radio-frequency module 100 according to the first embodiment in that the radio-frequency module 100c according to the third modification does not include the second resin layer 20 of the radio-frequency module 100 according to the first embodiment. The radio-frequency module 100c according to the third modification may include an underfill portion provided between the second major surface 132 of the mounting substrate 130 and the first IC chip 180 mounted on the second major surface 132 of the mounting substrate 130 and an underfill portion provided between the second major surface 132 of the mounting substrate 130 and the second IC chip 55 mounted on the second major surface 132 of the mounting substrate 130.

The material of the ball bump that makes up each of the plurality of external connection terminals 9 is, for example, gold, copper, solder, or the like.

The plurality of external connection terminals 9 may mixedly include the external connection terminals 9 each made up of a ball bump and the external connection terminals 9 each made up of a columnar electrode.

Second Embodiment

Figure 10:
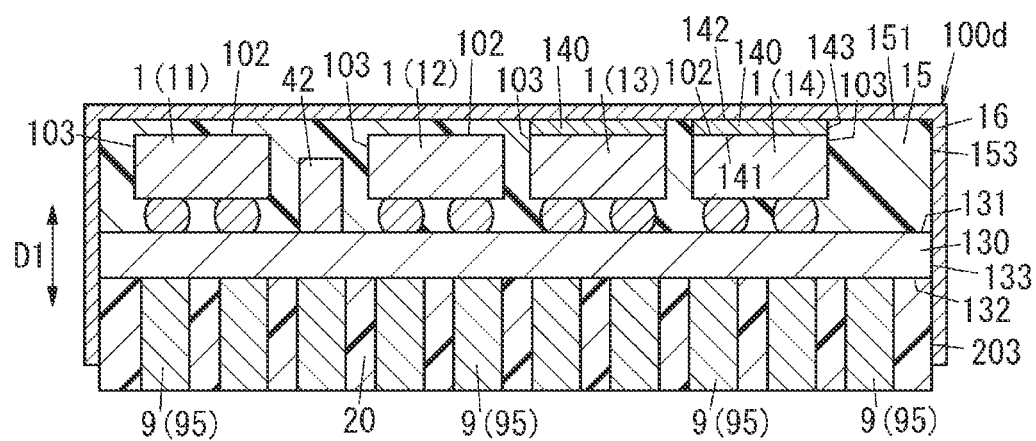
FIG. 10 is a cross-sectional view of a radio-frequency module according to a second embodiment.

A radio-frequency module 100d according to a second embodiment will be described with reference to FIG. 10. For the radio-frequency module 100d according to the second embodiment, like reference signs denote component elements similar to those of the radio-frequency module 100 according to the first embodiment, and the description is omitted. The circuit configuration of the radio-frequency module 100d is similar to the circuit configuration of the radio-frequency module 100 according to the first embodiment described with reference to FIGS. 5 and 6.

The radio-frequency module 100d according to the second embodiment differs from the radio-frequency module 100 according to the first embodiment in that the radio-frequency module 100d according to the second embodiment includes a plurality of metal members 140. Each of the plurality of metal members 140 is disposed on the major surface 102 of each of the power class 2 transmission filters 13, 14 of the plurality of transmission filters 1 on an opposite side to the mounting substrate 130 side.

The first resin layer 15 is disposed on the first major surface 131 of the mounting substrate 130 and covers the outer peripheral surfaces 103 of the plurality of transmission filters 1 and outer peripheral surfaces 143 of the plurality of metal members 140. The shield layer 16 covers the first resin layer 15 and the plurality of metal members 140. The plurality of metal members 140 is in contact with the shield layer 16.

In plan view in the thickness direction D1 of the mounting substrate 130, each of the plurality of metal members 140 has a rectangular shape; however, the configuration is not limited thereto. In plan view in the thickness direction D1 of the mounting substrate 130, each of the plurality of metal members 140 has the same size as a corresponding one of the transmission filters 1, with which the metal member 140 contacts; however, the configuration is not limited thereto. Each of the plurality of metal members 140 may be larger or may be smaller than a corresponding one of the transmission filters 1, with which the metal member 140 contacts. The material of the plurality of metal members 140 is, for example, copper or copper alloy. The plurality of metal members 140 may be respectively bonded to the major surfaces 102 of the transmission filters 1 or may be respectively in contact with the major surfaces 102. The materials of the plurality of metal members 140 are preferably the same and may be different from each other.

The radio-frequency module 100d according to the second embodiment includes a mounting substrate 130, first transmission filters 11, 12, second transmission filters 13, 14, metal members 140, a resin layer 15, and a shield layer 16. The mounting substrate 130 has a first major surface 131 and a second major surface 132 opposite to each other. The first transmission filters 11, 12 are mounted on the first major surface 131 of the mounting substrate 130. The second transmission filters 13, 14 are mounted on the first major surface 131 of the mounting substrate 130 and are higher in power class than the first transmission filters 11, 12. Each of the metal members 140 is disposed on a major surface 102 of a corresponding one of the second transmission filters 13, 14 on an opposite side to the mounting substrate 130 side. The resin layer 15 is disposed on the first major surface 131 of the mounting substrate 130. The shield layer 16 covers at least part of the resin layer 15. The resin layer 15 covers at least part of an outer peripheral surface 103 of each of the first transmission filters 11, 12, covers at least part of an outer peripheral surface 103 of each of the second transmission filters 13, 14, and covers at least part of an outer peripheral surface 143 of each of the metal members 140. The shield layer 16 overlaps at least part of each of the metal members 140 in plan view in the thickness direction D1 of the mounting substrate 130. At least part of a major surface 141 of each of the metal members 140 on an opposite side to the mounting substrate 130 side is in contact with the shield layer 16. In other words, at least part of an area covered with the shield layer 16 on the major surface 141 of each of the metal members 140 on an opposite side to the mounting substrate 130 side is in contact with the shield layer 16.

The radio-frequency module 100d according to the second embodiment includes a mounting substrate 130, transmission filters 13, 14, metal members 140, a resin layer 15, and a shield layer 16. The mounting substrate 130 has a first major surface 131 and a second major surface 132 opposite to each other. Each of the transmission filters 13, 14 is at least one transmission filter of a power class 1 transmission filter and a power class 2 transmission filter, mounted on the first major surface 131 of the mounting substrate 130. Each of the metal members 140 is disposed on a major surface 102 of a corresponding one of the transmission filters 13, 14 on an opposite side to the mounting substrate 130 side. The resin layer 15 is disposed on the first major surface 131 of the mounting substrate 130. The shield layer 16 covers at least part of the resin layer 15. The resin layer 15 covers at least part of an outer peripheral surface 103 of each of the transmission filters 13, 14 and covers at least part of an outer peripheral surface 143 of each of the metal members 140. The shield layer 16 overlaps at least part of each of the metal members 140 in plan view in the thickness direction D1 of the mounting substrate 130. At least part of a major surface 141 of each of the metal members 140 on an opposite side to the mounting substrate 130 side is in contact with the shield layer 16. In other words, at least part of an area covered with the shield layer 16 on the major surface 141 of each of the metal members 140 on an opposite side to the mounting substrate 130 side is in contact with the shield layer 16.

In the radio-frequency module 100d according to the second embodiment, as described above, the major surface 102 of each of the (second) transmission filters 13, 14 on an opposite side to the mounting substrate 130 side is in contact with the shield layer 16 with the metal member 140 interposed therebetween. Therefore, the heat generated in the (second) transmission filters 13, 14 can be dissipated through the metal members 140 and the shield layer 16. Thus, it is possible to improve the heat dissipation capability. The radio-frequency module 100d according to the second embodiment is capable of stabilizing the temperature characteristics of an acoustic wave filter that makes up each of the (second) transmission filters 13, 14 and is capable of stabilizing the characteristics of the radio-frequency module 100.

(First Modification)

Figure 11:
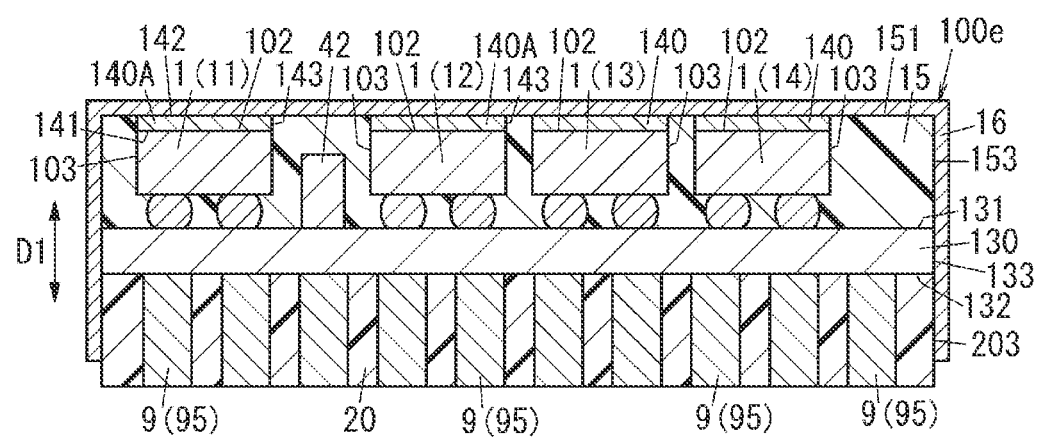
FIG. 11 is a cross-sectional view of a radio-frequency module according to a first modification of the second embodiment.

A radio-frequency module 100e according to a first modification of the second embodiment will be described with reference to FIG. 11. For the radio-frequency module 100e according to the first modification, like reference signs denote component elements similar to those of the radio-frequency module 100d according to the second embodiment, and the description is omitted. The circuit configuration of the radio-frequency module 100e is similar to the circuit configuration of the radio-frequency module 100 according to the first embodiment described with reference to FIGS. 5 and 6.

The radio-frequency module 100e according to the first modification differs from the radio-frequency module 100d according to the second embodiment in that the radio-frequency module 100e according to the first modification further includes contact members 140A respectively disposed on the major surfaces 102 of the power class 3 transmission filters 11, 12 on an opposite side to the mounting substrate 130 side.

In the radio-frequency module 100e according to the first modification, as in the case of the radio-frequency module 100 according to the second embodiment, the major surface 102 of each of the power class 2 transmission filters 13, 14 on an opposite side to the mounting substrate 130 side is in contact with the shield layer 16 with the metal member 140 interposed therebetween, so it is possible to improve the heat dissipation capability.

In the radio-frequency module 100e according to the first modification, the major surface 102 of each of the power class 3 transmission filters 11, 12 on an opposite side to the mounting substrate 130 side is in contact with the shield layer 16 with the contact member 140A interposed therebetween, so it is possible to further improve the heat dissipation capability.

(Second Modification)

Figure 12:
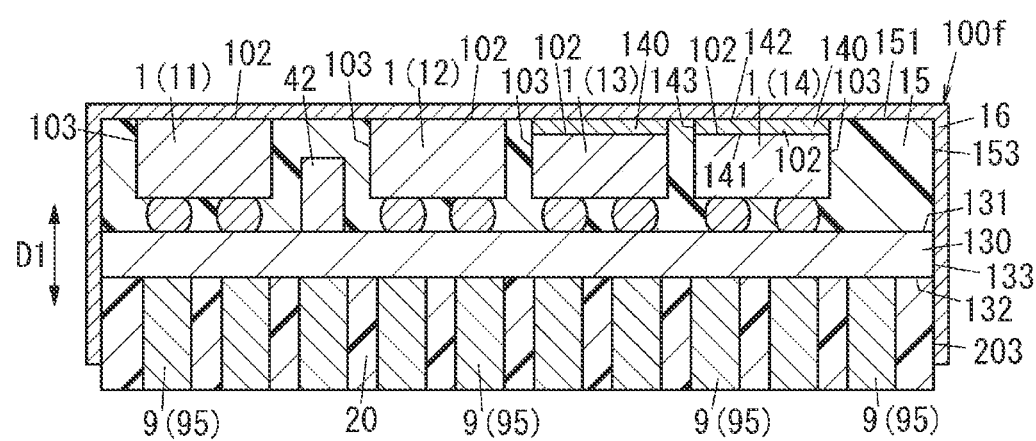
FIG. 12 is a cross-sectional view of a radio-frequency module according to a second modification of the second embodiment.

A radio-frequency module 100f according to a second modification of the second embodiment will be described with reference to FIG. 12. For the radio-frequency module 100f according to the second modification, like reference signs denote component elements similar to those of the radio-frequency module 100d according to the second embodiment, and the description is omitted. The circuit configuration of the radio-frequency module 100f is similar to the circuit configuration of the radio-frequency module 100 according to the first embodiment described with reference to FIGS. 5 and 6.

The radio-frequency module 100f according to the second modification differs from the radio-frequency module 100d according to the second embodiment in that the major surface 102 of each of the power class 3 transmission filters 11, 12 on an opposite side to the mounting substrate 130 side is in contact with the shield layer 16.

In the radio-frequency module 100f according to the second modification, as in the case of the radio-frequency module 100d according to the second embodiment, the major surface 102 of each of the power class 2 transmission filters 13, 14 on an opposite side to the mounting substrate 130 side is in contact with the shield layer 16 with the metal member 140 interposed therebetween, so it is possible to improve the heat dissipation capability.

In the radio-frequency module 100f according to the second modification, the major surface 102 of each of the power class 3 transmission filters 11, 12 on an opposite side to the mounting substrate 130 side is in contact with the shield layer 16, so it is possible to further improve the heat dissipation capability.

(Other Modifications)

Each of the above-described first and second embodiments and the like is just one of various embodiments of the present disclosure. The above-described first and second embodiments, and the like, each may be modified into various forms according to design, or the like, as long as the possible benefit of the present disclosure is achieved.

For example, the number of the transmission filters 1 just needs to be multiple and is not limited to four. The major surface 102 of each of the relatively high power class transmission filters 1 of the plurality of transmission filters 1 on an opposite side to the mounting substrate 130 side just needs to be in contact with the shield layer 16, and a transmission filter 1 of which the major surface 102 is covered with the first resin layer 15 may be included.

Each of the plurality of transmission filters 1 and the plurality of receiving filters 2 may be a filter that is a component of a duplexer. In other words, the transmission filter 11 and the receiving filter 21 may make up a first duplexer, the transmission filter 12 and the receiving filter 22 may make up a second duplexer, the transmission filter 13 and the receiving filter 23 may make up a third duplexer, and the transmission filter 14 and the receiving filter 24 may make up a fourth duplexer. In this case, at least the major surface of each of the third duplexer and the fourth duplexer on an opposite side to the mounting substrate 130 side just needs to be in contact with the shield layer 16 directly or indirectly (with the metal member 140 interposed therebetween).

In the radio-frequency module 100 according to the first embodiment, the major surface 102 of each of the transmission filters 13, 14 on an opposite side to the mounting substrate 130 side and the major surface 151 of the resin layer 15 are substantially flush with each other; however, the configuration is not limited thereto.

For example, each of the plurality of transmission filters 1 and the plurality of receiving filters 2 is not limited to a surface acoustic wave filter and may be, for example, a bulk acoustic wave (BAW) filter. A resonator in the BAW filter is, for example, a film bulk acoustic resonator (FBAR) or a solidly mounted resonator (SMR). The BAW filter has a substrate. The substrate is, for example, a silicon substrate.

Each of the plurality of transmission filters 1 and the plurality of receiving filters 2 is not limited to a ladder filter and may be, for example, a longitudinally coupled resonator-type surface acoustic wave filter.

The above-described acoustic wave filter is an acoustic wave filter that uses surface acoustic waves or bulk acoustic waves; however, the configuration is not limited thereto. The above-described acoustic wave filter may be, for example, an acoustic wave filter that uses boundary acoustic waves, plate waves, or the like.

The power amplifier 3 is not limited to a differential amplifier circuit. The power amplifier 3 may have a configuration including a driver stage amplifier, an output stage amplifier, and an inter-stage matching circuit that matches the impedance between the driver stage amplifier and the output stage amplifier. In this case, the inter-stage matching circuit is, for example, an inductor provided between the driver stage amplifier and the output stage amplifier and may further include a capacitor in addition to the inductor. The number of the stages of the amplifier in the power amplifier 3 is not limited to two and may be one or may be three or more.

The number of the input matching circuits 17 is not limited to multiple and may be one.

The plurality of circuit components may include a circuit component electrically connected to the mounting substrate 130 with a bump interposed therebetween and a circuit component electrically connected to the mounting substrate 130 with solder interposed therebetween. Alternatively, for example, the plurality of circuit components may include a circuit component electrically connected to the mounting substrate 130 with a bonding wire interposed therebetween.

The radio-frequency module 100 may further include a heat dissipation conductor portion disposed on the second major surface 132 of the mounting substrate 130 and overlapping the power amplifier 3 in the thickness direction D1 of the mounting substrate 130. One ends of the plurality of external connection terminals 9 may make up the heat dissipation conductor portion.

In the radio-frequency module 100 according to the first embodiment and the radio-frequency module 100d according to the second embodiment, the major surface 102 of each of the plurality of transmission filters 13, 14 on an opposite side to the mounting substrate 130 side is in contact with the shield layer 16 directly or indirectly (with the metal member 140 interposed therebetween); however, the configuration is not limited thereto. Alternatively, for example, the major surface 102 of one of the plurality of transmission filters 13, 14 may be in contact with the shield layer 16 directly or indirectly.

Furthermore, in the radio-frequency module 100a according to the first modification of the first embodiment, the radio-frequency module 100b according to the second modification of the first embodiment, the radio-frequency module 100e according to the first modification of the second embodiment, and the radio-frequency module 100f according to the second modification of the second embodiment, the major surface 102 of each of the plurality of transmission filters 11, 12 on an opposite side to the mounting substrate 130 side is in contact with the shield layer 16 directly or indirectly (with the metal member 140 interposed therebetween); however, the configuration is not limited thereto. Alternatively, for example, the major surface 102 of one of the plurality of transmission filters 11, 12 may be in contact with the shield layer 16 directly or indirectly.

In the radio-frequency modules 100, 100a to 100f, the entire part of the outer peripheral surface 103 of each of the transmission filters 11, 12, 13, 14 is covered with the first resin layer 15. Alternatively, part of the outer peripheral surface 103 may be covered with the first resin layer 15. In the radio-frequency modules 100, 100a to 100c, the entire part of the major surface 102 of each of the transmission filters 13, 14 on an opposite side to the mounting substrate 130 side is in contact with the shield layer 16. Alternatively, part of the major surface 102 may be in contact with the shield layer 16.

In the radio-frequency modules 100d to 100f, the entire part of the outer peripheral surface 143 of each of the plurality of metal members 140 is covered with the first resin layer 15. Alternatively, part of the outer peripheral surface 143 may be covered with the first resin layer 15. In the radio-frequency modules 100d to 100f, the entire part of the major surface 142 of each of the plurality of metal members 140 on an opposite side to the mounting substrate 130 side is in contact with the shield layer 16. Alternatively, part of the major surface 142 may be in contact with the shield layer 16.

In the radio-frequency modules 100a, 100f, the entire part of the major surface 102 of each of the transmission filters 11, 12 on an opposite side to the mounting substrate 130 side is in contact with the shield layer 16. Alternatively, part of the major surface 102 may be in contact with the shield layer 16. In the radio-frequency modules 100b, 100e, the entire part of the major surface 142 of each of the plurality of contact members 140A on an opposite side to the mounting substrate 130 side is in contact with the shield layer 16. Alternatively, part of the major surface 142 may be in contact with the shield layer 16.

In the radio-frequency modules 100, 100a to 100c, the entire part of the major surface 102 of each of the transmission filters 13, 14 on an opposite side to the mounting substrate 130 side is covered with the shield layer 16. Alternatively, part of the major surface 102 may be covered with the shield layer 16. In the radio-frequency modules 100d to 100f, the entire part of the major surface 142 of each of the plurality of metal members 140 on an opposite side to the mounting substrate 130 side is covered with the shield layer 16. Alternatively, part of the major surface 142 may be covered with the shield layer 16.

Each of the radio-frequency modules 100, 100a to 100f includes the power class 3 transmission filters 11, 12 and the power class 2 transmission filters 13, 14; however the configuration is not limited thereto. A radio-frequency module may include, for example, a power class 1 transmission filter, a power class 2 transmission filter, and a power class 3 transmission filter. In this case, at least, at least part of the major surface of the power class 1 transmission filter on an opposite side to the mounting substrate 130 side just needs to be in contact with the shield layer 16, and at least part of the major surface of each of the power class 2 transmission filter and the power class 3 transmission filter on an opposite side to the mounting substrate 130 side may be in contact with the shield layer 16 or does not need to be in contact with the shield layer 16.

Furthermore, a radio-frequency module may include, for example, a power class 1 transmission filter and a power class 2 transmission filter. In this case, at least, at least part of the major surface of the power class 1 transmission filter on an opposite side to the mounting substrate 130 side just needs to be in contact with the shield layer 16, and at least part of the major surface of the power class 2 transmission filter on an opposite side to the mounting substrate 130 side may be in contact with the shield layer 16 or does not need to be in contact with the shield layer 16.

Furthermore, a radio-frequency module may include, for example, a power class 1 transmission filter and a power class 3 transmission filter. In this case, at least, at least part of the major surface of the power class 1 transmission filter on an opposite side to the mounting substrate 130 side just needs to be in contact with the shield layer 16, and at least part of the major surface of the power class 3 transmission filter on an opposite side to the mounting substrate 130 side may be in contact with the shield layer 16 or does not need to be in contact with the shield layer 16.

A radio-frequency module may include, for example, only a plurality of power class 1 transmission filters. In this case, at least part of the major surface of at least one of the plurality of power class 1 transmission filters on an opposite side to the mounting substrate 130 side just needs to be in contact with the shield layer 16. A radio-frequency module may include, for example, only a plurality of power class 2 transmission filters. In this case, at least part of the major surface of at least one of the plurality of power class 2 transmission filters on an opposite side to the mounting substrate 130 side just needs to be in contact with the shield layer 16.

In the radio-frequency modules 100, 100a to 100f, the first communication band is 5G NR standard n3, and the second communication band is 5G NR standard n1; however, the configuration is not limited thereto. Each of the first communication band and the second communication band just needs to be, for example, any one of 5G NR standard n1, n3, n25, n66. In the radio-frequency modules 100, 100a to 100f, the fifth communication band is 3GPP LTE standard Band 34 and the sixth communication band is 3GPP LTE standard Band 39; however, the configuration is not limited thereto. Each of the fifth communication band and the sixth communication band just needs to be, for example, any one of 3GPP LTE standard Band 34, Band 39, Band 7, Band 30, Band 11, Band 21, and Band 32.

The circuit configuration of each of the radio-frequency modules 100, 100a, 100b, 100c, 100d, 100e, 100f is not limited to the above-described example. Each of the radio-frequency modules 100, 100a, 100b, 100c, 100d, 100e, 100f may have, for example, a radio-frequency front-end circuit that supports multi input multi output (MIMO) as a circuit configuration.

The communication device 300 according to the first embodiment may include any one of the radio-frequency modules 100a, 100b, 100c, 100d, 100e, 100f instead of the radio-frequency module 100.

(Aspects)

The following aspects are disclosed in the specification.

A radio-frequency module (100; 100a; 100b) according to a first aspect includes a mounting substrate (130), a first transmission filter (11, 12), a second transmission filter (13, 14), a resin layer (15), and a shield layer (16). The mounting substrate (130) has a first major surface (131) and a second major surface (132) opposite to each other. The first transmission filter (11, 12) is mounted on the first major surface (131) of the mounting substrate (130). The second transmission filter (13, 14) is mounted on the first major surface (131) of the mounting substrate (130) and is higher in power class than the first transmission filter (11, 12). The resin layer (15) is disposed on the first major surface (131) of the mounting substrate (130). The shield layer (16) covers at least part of the resin layer (15). The resin layer (15) covers at least part of an outer peripheral surface (103) of the first transmission filter (11, 12) and covers at least part of an outer peripheral surface (103) of the second transmission filter (13, 14). The shield layer (16) overlaps at least part of the second transmission filter (13, 14) in plan view in a thickness direction (D1) of the mounting substrate (130). At least part of a major surface (102) of the second transmission filter (13, 14) on an opposite side to the mounting substrate (130) side is in contact with the shield layer (16).

According to this aspect, at least part of the major surface (102) of the second transmission filter (13, 14) on an opposite side to the mounting substrate (130) side is in contact with the shield layer (16), so it is possible to dissipate the heat generated in the second transmission filter (13, 14) through the shield layer (16), with the result that it is possible to improve the heat dissipation capability.

A radio-frequency module (100d; 100e; 100f) according to a second aspect includes a mounting substrate (130), a first transmission filter (11, 12), a second transmission filter (13, 14), a metal member (140), a resin layer (15), and a shield layer (16). The mounting substrate (130) has a first major surface (131) and a second major surface (132) opposite to each other. The first transmission filter (11, 12) is mounted on the first major surface (131) of the mounting substrate (130). The second transmission filter (13, 14) is mounted on the first major surface (131) of the mounting substrate (130) and is higher in power class than the first transmission filter (11, 12). The metal member (140) is disposed on a major surface (102) of the second transmission filter (13, 14) on an opposite side to the mounting substrate (130) side. The resin layer (15) is disposed on the first major surface (131) of the mounting substrate (130). The shield layer (16) covers at least part of the resin layer (15). The resin layer (15) covers at least part of an outer peripheral surface (103) of the first transmission filter (11, 12), covers at least part of the outer peripheral surface (103) of the second transmission filter (13, 14), and covers at least part of an outer peripheral surface (143) of the metal member (140). The shield layer (16) overlaps at least part of the metal member (140) in plan view in a thickness direction (D1) of the mounting substrate (130). At least part of the major surface (141) of the metal member (140) on an opposite side to the mounting substrate (130) side is in contact with the shield layer (16).

According to this aspect, the major surface (102) of the second transmission filter (13, 14) on an opposite side to the mounting substrate (130) side is in contact with the shield layer (16) with the metal member (140) interposed therebetween, so it is possible to dissipate the heat generated in the second transmission filter (13, 14) through the metal member (140) and the shield layer (16), with the result that it is possible to improve the heat dissipation capability.

In a radio-frequency module (100; 100d) according to a third aspect, in the first or second aspect, the major surface (102) of the first transmission filters (11, 12) on an opposite side to the mounting substrate (130) side is spaced apart from the shield layer (16) in the thickness direction (D1) of the mounting substrate (130).

According to this aspect, a printable area is increased, and an increase in the material cost is suppressed.

A radio-frequency module (100; 100a; 100b) according to a fourth aspect includes a mounting substrate (130), a transmission filter (13, 14), a resin layer (15), and a shield layer (16). The mounting substrate (130) has a first major surface (131) and a second major surface (132) opposite to each other. The transmission filter (13, 14) is at least one transmission filter of a power class 1 transmission filter and a power class 2 transmission filter, mounted on the first major surface (131) of the mounting substrate (130). The resin layer (15) is disposed on the first major surface (131) of the mounting substrate (130). The shield layer (16) covers at least part of the resin layer (15). The resin layer (15) covers at least part of an outer peripheral surface (103) of the transmission filter (13, 14). The shield layer (16) overlaps at least part of the transmission filter (13, 14) in plan view in a thickness direction (D1) of the mounting substrate (130). At least part of a major surface (102) of the transmission filter (13, 14) on an opposite side to the mounting substrate (130) side is in contact with the shield layer (16).

According to this aspect, at least part of the major surface (102) of the transmission filter (13, 14) on an opposite side to the mounting substrate (130) side is in contact with the shield layer (16), so it is possible to dissipate the heat generated in the transmission filter (13, 14) through the shield layer (16), with the result that it is possible to improve the heat dissipation capability.

A radio-frequency module (100d; 100e; 100f) according to a fifth aspect includes a mounting substrate (130), a transmission filter (13, 14), a metal member (140), a resin layer (15), and a shield layer (16). The mounting substrate (130) has a first major surface (131) and a second major surface (132) opposite to each other. The transmission filter (13, 14) is at least one transmission filter of a power class 1 transmission filter and a power class 2 transmission filter, mounted on the first major surface (131) of the mounting substrate (130). The metal member (140) is disposed on a major surface (102) of the transmission filter (13, 14) on an opposite side to the mounting substrate (130) side. The resin layer (15) is disposed on the first major surface (131) of the mounting substrate (130). The shield layer (16) covers at least part of the resin layer (15). The resin layer (15) covers at least part of an outer peripheral surface (103) of the transmission filter (13, 14) and covers at least part of an outer peripheral surface (143) of the metal member (140). The shield layer (16) overlaps at least part of the metal member (140) in plan view in a thickness direction (D1) of the mounting substrate (130). At least part of a major surface (141) of the metal member (140) on an opposite side to the mounting substrate (130) side is in contact with the shield layer (16).

According to this aspect, the major surface (102) of the transmission filter (13, 14) on an opposite side to the mounting substrate (130) side is in contact with the shield layer (16) with the metal member (140) interposed therebetween, so it is possible to dissipate the heat generated in the transmission filter (13, 14) through the metal member (140) and the shield layer (16), with the result that it is possible to improve the heat dissipation capability.

A radio-frequency module (100a; 100f) according to a sixth aspect, in the fourth or fifth aspect, further includes a power class 3 transmission filter (11, 12). The power class 3 transmission filter (11, 12) is a separate body from the transmission filter (13, 14) and is mounted on the first major surface (131) of the mounting substrate (130). At least part of a major surface (102) of the power class 3 transmission filter (11, 12) on an opposite side to the mounting substrate (130) side is in contact with the shield layer (16).

According to this aspect, at least part of the major surface (102) of the power class 3 transmission filter (11, 12) on an opposite side to the mounting substrate (130) side is in contact with the shield layer (16), so it is possible to dissipate the heat generated in the power class 3 transmission filter (11, 12) through the shield layer (16), with the result that it is possible to further improve the heat dissipation capability.

A radio-frequency module (100b; 100e) according to a seventh aspect, in the fourth or fifth aspect, further includes a power class 3 transmission filter (11, 12) and a contact member (140A). The power class 3 transmission filter (11, 12) is a separate body from the transmission filter (13, 14)

and is mounted on the first major surface (131) of the mounting substrate (130). The contact member (140A) is made of a metal material and is disposed on a major surface (102) of the power class 3 transmission filter (11, 12) on an opposite side to the mounting substrate (130) side. At least part of a major surface (141) of the contact member (140A) on an opposite side to the mounting substrate (130) side is in contact with the shield layer (16).

According to this aspect, the major surface (102) of the power class 3 transmission filter (11, 12) on an opposite side to the mounting substrate (130) side is in contact with the shield layer (16) with the contact member (140A) interposed therebetween, so it is possible to dissipate the heat generated in the power class 3 transmission filter (11, 12) through the contact member (140A) and the shield layer (16), with the result that it is possible to improve the heat dissipation capability.

A communication device (300) according to an eighth aspect includes the radio-frequency module (100; 100a to 100f) according to any one of the first to seventh aspects, and a signal processing circuit (301). The signal processing circuit (301) is connected to the radio-frequency module (100; 100a to 100f).

According to this aspect, the communication device (300) includes the radio-frequency module (100; 100a to 100f), so it is possible to improve the heat dissipation capability.

1 transmission filter
11, 12 transmission filter (first transmission filter, power class 3 transmission filter)
13, 14 transmission filter (second transmission filter, power class 2 transmission filter)
102 major surface
103 outer peripheral surface
2 receiving filter
21 to 26 receiving filter
3 power amplifier
31 driver stage amplifier
32A final stage amplifier
32B final stage amplifier
33 unbalance-balance conversion circuit (first balun)
331 unbalanced terminal
332A balanced terminal
332B balanced terminal
4 output matching circuit
41 balance-unbalance conversion circuit (second balun)
411A balanced terminal
411B balanced terminal
412 unbalanced terminal
42 circuit element
15 first resin layer (resin layer)
151 major surface
153 outer peripheral surface
16 shield layer
20 second resin layer
201 major surface
203 outer peripheral surface
5 first switch
50 common terminal
51 selection terminal
511 to 514 selection terminal
55 second IC chip
6 matching circuit (first matching circuit)
61 to 64 matching circuit
7 second switch
70 common terminal
70A to 70C selection terminal
71 selection terminal
711 to 716 selection terminal
8 matching circuit (second matching circuit)
9 external connection terminal
91A, 91B, 91C antenna terminal
92 signal input terminal
93 signal output terminal
94 control terminal
95 ground terminal
17 input matching circuit
171 to 176 input matching circuit
18 low-noise amplifier
180 IC chip (first IC chip)
19 controller
100, 100a, 100b, 100c, 100d, 100e, 100f radio-frequency module
130 mounting substrate
131 first major surface
132 second major surface
133 outer peripheral surface
140 metal member
140A contact member
141 major surface
142 major surface
143 outer peripheral surface
300 communication device
301 signal processing circuit
302 RF signal processing circuit
303 baseband signal processing circuit
A1 antenna (first antenna)
A2 antenna (second antenna)
A3 antenna (third antenna)
C1 capacitor
D1 thickness direction
L1 inductor element
L2 inductor element
L3 inductor element
L4 inductor element
L10 primary inductor
L11 secondary inductor
La1 inductor
La2 inductor
Lc1 inductor
Lc2 inductor
T1 first transformer
T2 second transformer
Vcc1 voltage
W1 wire
W2 wire

The invention claimed is:
1. A radio-frequency module comprising:
a mounting substrate having a first major surface and a second major surface opposite to each other;
a first transmission filter mounted on the first major surface of the mounting substrate;
a second transmission filter mounted on the first major surface of the mounting substrate and higher in power class than the first transmission filter;
a resin layer disposed on the first major surface of the mounting substrate; and
a shield layer covering at least part of the resin layer, wherein
the resin layer covers at least part of an outer peripheral surface of the first transmission filter and covers at least part of an outer peripheral surface of the second transmission filter, the shield layer overlaps at least part of the second transmission filter in plan view in a thickness direction of the mounting substrate, and at least part of a major surface of the second transmission filter on an opposite side to the mounting substrate side is in contact with the shield layer.

2. The radio-frequency module according to claim 1, wherein a major surface of the first transmission filter on an opposite side to the mounting substrate side is spaced apart from the shield layer in the thickness direction of the mounting substrate.

3. A communication device comprising:
the radio-frequency module according to claim 2; and
a signal processing circuit connected to the radio-frequency module.

4. A communication device comprising:
the radio-frequency module according to claim 1; and
a signal processing circuit connected to the radio-frequency module.

5. A radio-frequency module comprising:
a mounting substrate having a first major surface and a second major surface opposite to each other;
a first transmission filter mounted on the first major surface of the mounting substrate;
a second transmission filter mounted on the first major surface of the mounting substrate and higher in power class than the first transmission filter;
a metal member disposed on a major surface of the second transmission filter on an opposite side to the mounting substrate side;
a resin layer disposed on the first major surface of the mounting substrate; and
a shield layer covering at least part of the resin layer, wherein
the resin layer covers at least part of an outer peripheral surface of the first transmission filter, covers at least part of an outer peripheral surface of the second transmission filter, and covers at least part of an outer peripheral surface of the metal member,
the shield layer overlaps at least part of the metal member in plan view in a thickness direction of the mounting substrate, and
at least part of a major surface of the metal member on an opposite side to the mounting substrate side is in contact with the shield layer.

6. The radio-frequency module according to claim 5, wherein a major surface of the first transmission filter on an opposite side to the mounting substrate side is spaced apart from the shield layer in the thickness direction of the mounting substrate.

7. A communication device comprising:
the radio-frequency module according to claim 5; and
a signal processing circuit connected to the radio-frequency module.

8. A radio-frequency module comprising:
a mounting substrate having a first major surface and a second major surface opposite to each other;
at least one transmission filter of a power class 1 transmission filter and a power class 2 transmission filter, mounted on the first major surface of the mounting substrate;
a resin layer disposed on the first major surface of the mounting substrate; and
a shield layer covering at least part of the resin layer, wherein the resin layer covers at least part of an outer peripheral surface of the at least one transmission filter,
the shield layer overlaps at least part of the at least one transmission filter in plan view in a thickness direction of the mounting substrate, and
at least part of a major surface of the at least one transmission filter on an opposite side to the mounting substrate side is in contact with the shield layer.

9. The radio-frequency module according to claim 8, further comprising a power class 3 transmission filter being a separate body from the at least one transmission filter and mounted on the first major surface of the mounting substrate, wherein at least part of a major surface of the power class 3 transmission filter on an opposite side to the mounting substrate side is in contact with the shield layer.

10. A communication device comprising:
the radio-frequency module according to claim 9; and
a signal processing circuit connected to the radio-frequency module.

11. The radio-frequency module according to claim 8, further comprising:

a power class 3 transmission filter being a separate body from the at least one transmission filter and mounted on the first major surface of the mounting substrate; and
a contact member comprising a metal material and disposed on a major surface of the power class 3 transmission filter on an opposite side to the mounting substrate side, wherein at least part of a major surface of the contact member on an opposite side to the mounting substrate side is in contact with the shield layer.

12. A communication device comprising:
the radio-frequency module according to claim 11; and
a signal processing circuit connected to the radio-frequency module.

13. A communication device comprising:
the radio-frequency module according to claim 8; and
a signal processing circuit connected to the radio-frequency module.

14. A radio-frequency module comprising:
a mounting substrate having a first major surface and a second major surface opposite to each other;
at least one transmission filter of a power class 1 transmission filter and a power class 2 transmission filter, mounted on the first major surface of the mounting substrate;
a metal member disposed on a major surface of the at least one transmission filter on an opposite side to the mounting substrate side;
a resin layer disposed on the first major surface of the mounting substrate; and
a shield layer covering at least part of the resin layer, wherein
the resin layer covers at least part of an outer peripheral surface of the at least one transmission filter and covers at least part of an outer peripheral surface of the metal member,
the shield layer overlaps at least part of the metal member in plan view in a thickness direction of the mounting substrate, and
at least part of a major surface of the metal member on an opposite side to the mounting substrate side is in contact with the shield layer.

15. The radio-frequency module according to claim 14, further comprising a power class 3 transmission filter being a separate body from the at least one transmission filter and mounted on the first major surface of the mounting substrate, wherein at least part of a major surface of the power class 3 transmission filter on an opposite side to the mounting substrate side is in contact with the shield layer.

16. The radio-frequency module according to claim 14, further comprising:

a power class 3 transmission filter being a separate body from the at least one transmission filter and mounted on the first major surface of the mounting substrate; and a contact member comprising a metal material and disposed on a major surface of the power class 3 transmission filter on an opposite side to the mounting substrate side, wherein at least part of a major surface of the contact member on an opposite side to the mounting substrate side is in contact with the shield layer.

17. A communication device comprising:

the radio-frequency module according to claim 14; and a signal processing circuit connected to the radio-frequency module.

\* \* \* \* \*